United States Patent
Kan et al.

(10) Patent No.: US 9,219,166 B2
(45) Date of Patent: Dec. 22, 2015

(54) NONVOLATILE FLASH MEMORY STRUCTURES INCLUDING FULLERENE MOLECULES AND METHODS FOR MANUFACTURING THE SAME

(71) Applicants: CORNELL UNIVERSITY, Ithaca, NY (US); NANO-C, INC., Westwood, MA (US)

(72) Inventors: Edwin C. Kan, Ithaca, NY (US); Qianying Xu, Ithaca, NY (US); Ramesh Sivarajan, Shrewbury, MA (US); Henning Richter, Newton, MA (US); Viktor Vejins, Concord, MA (US)

(73) Assignee: CORNELL UNIVERSITY, Ithaca, NY (US)

(*) Notice: Subject to any disclaimer, the term of this patent is extended or adjusted under 35 U.S.C. 154(b) by 67 days.

(21) Appl. No.: 14/138,294

(22) Filed: Dec. 23, 2013

(65) Prior Publication Data

US 2014/0169104 A1 Jun. 19, 2014

Related U.S. Application Data

(60) Division of application No. 13/188,077, filed on Jul. 21, 2011, now abandoned, which is a continuation-in-part of application No. 12/748,253, filed on Mar. 26, 2010, now Pat. No. 8,542,540.

(60) Provisional application No. 61/163,883, filed on Mar. 27, 2009.

(51) Int. Cl.
*G11C 11/34* (2006.01)
*H01L 29/788* (2006.01)
(Continued)

(52) U.S. Cl.
CPC ............ *H01L 29/7883* (2013.01); *B82Y 10/00* (2013.01); *G11C 16/10* (2013.01); *H01L 21/28273* (2013.01); *H01L 21/28282* (2013.01); *H01L 27/11521* (2013.01);
(Continued)

(58) Field of Classification Search
CPC .......... G11C 16/0408; G11C 16/0416; G11C 16/045
USPC ............................................. 365/174, 185.01
See application file for complete search history.

(56) References Cited

U.S. PATENT DOCUMENTS 7,482,619 B2 * 1/2009 Seol et al. ....................... 257/24
7,504,280 B2 3/2009 Khang et al.
(Continued)

*Primary Examiner* — Han Yang
(74) *Attorney, Agent, or Firm* — William Greener; Alek P. Szecsy; Bond, Schoeneck & King PLLC

(57) ABSTRACT

Embodiments of tunneling barriers and methods for same can embed molecules exhibiting a monodispersion characteristic into a dielectric layer (e.g., between first and second layers forming a dielectric layer). In one embodiment, by embedding $C_{60}$ molecules inbetween first and second insulating layers forming a dielectric layer, a field sensitive tunneling barrier can be implemented. In one embodiment, the tunneling barrier can be between a floating gate and a channel in a semiconductor structure. In one embodiment, a tunneling film can be used in nonvolatile memory applications where $C_{60}$ provides accessible energy levels to prompt resonant tunneling through the dielectric layer upon voltage application. Embodiments also contemplate engineered fullerene molecules incorporated within the context of at least one of a tunneling dielectric and a floating gate within a nonvolatile flash memory structure.

26 Claims, 16 Drawing Sheets

(51) Int. Cl.
  *B82Y 10/00* (2011.01)
  *H01L 21/28* (2006.01)
  *H01L 27/115* (2006.01)
  *H01L 29/423* (2006.01)
  *H01L 29/51* (2006.01)
  *G11C 16/10* (2006.01)
  *G11C 16/04* (2006.01)
(52) U.S. Cl.
  CPC ... *H01L 27/11568* (2013.01); *H01L 29/42324* (2013.01); *H01L 29/51* (2013.01); *H01L 29/513* (2013.01); *G11C 16/0466* (2013.01)

(56) References Cited

U.S. PATENT DOCUMENTS

| | | | |
|---|---|---|---|
| 7,572,662 B2 | 8/2009 | Khang et al. | |
| 7,858,978 B2 | 12/2010 | Kim et al. | |
| 2006/0212976 A1* | 9/2006 | Khang et al. | 977/842 |
| 2009/0176358 A1 | 7/2009 | Poeppel et al. | |

* cited by examiner

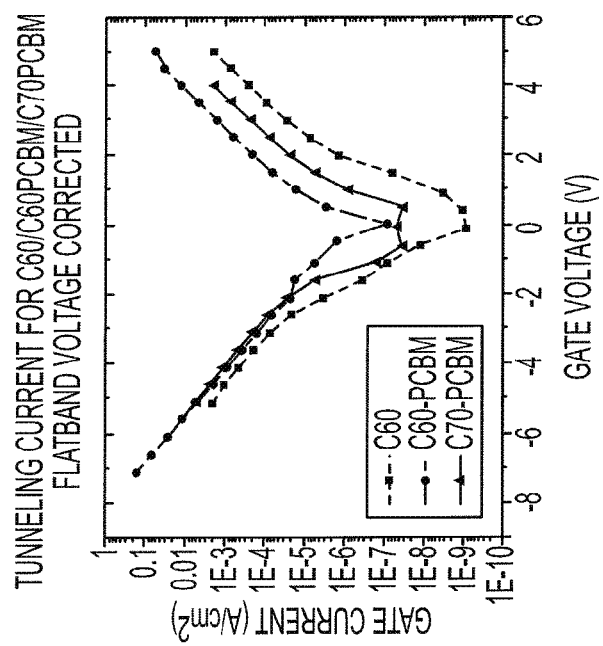
FIG. 9D
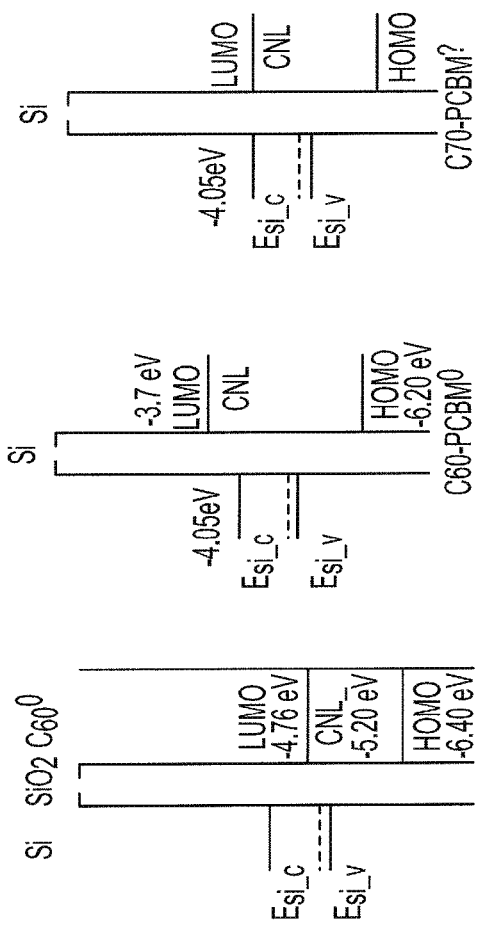
FIG. 9C
FIG. 9B
FIG. 9A

NONVOLATILE FLASH MEMORY STRUCTURES INCLUDING FULLERENE MOLECULES AND METHODS FOR MANUFACTURING THE SAME

CROSS-REFERENCE TO RELATED APPLICATIONS

This application is divisional application of application Ser. No. 13/188,077 filed Jul. 21, 2011, which is a continuation-in-part (CIP) application of application Ser. No. 12/748,243 filed Mar. 26, 2010 entitled "Nonvolatile Memory and Methods for Manufacturing Same With Molecule-Engineered Tunneling Barriers", which claims the priority of U.S. Provisional Application Ser. No. 61/163,883 filed Mar. 27, 2009 entitled "Resonant Tunneling Barrier Using $C_{60}$ For Tunnel Oxide In Flash Memory," the subject matters of all of which are incorporated herein by reference in their entireties.

This application further relates to and derives priority from: (1) U.S. Provisional Patent Application Ser. No. 61/367,132, titled "Engineered Fullerene Molecules for Flash Memory Charge Storage" filed 23 Jul. 2010; and (2) U.S. Provisional Patent Application Ser. No. 61/367,144 titled "Engineered Fullerene Molecules (EFM) in Resonant Double Tunnel Structures for Non-Volatile Memory Applications" filed 23 Jul. 2010, the contents of which are incorporated herein fully by reference.

STATEMENT REGARDING FEDERALLY SPONSORED RESEARCH OR DEVELOPMENT

This invention was made with Government support under Grant Number EEC-0646547 awarded by the National Science Foundation. The work described herein was also funded by the National Science Foundation under STTR grant number IIP-0930526. The United States Government has certain rights in the invention.

BACKGROUND

1. Field of the Invention

The present invention relates to tunneling barriers, charge storage layers and/or semiconductor structures including tunneling barriers and charge storage layers, and also to methods for manufacturing the same.

2. Description of the Related Art

In the related art, charge-based nonvolatile flash memory technology, the ratio between retention time $t_R$ and program/erase (P/E) time $t_{PE}$ is about $10^{12}$-$10^{14}$. To realize this tremendous ratio, field asymmetric tunneling processes in the tunneling barrier have to be deliberately engineered between data retention and data P/E. The asymmetry in the related art flash memory cells can be provided by external P/E voltages.

For example, in NAND flash memory, the asymmetry between the Fowler-Nordheim tunneling under data P/E and the direct tunneling during data retention is exploited. However, this related art approach limits the scalability of the P/E voltage, which is quickly becoming the major scaling roadblock, considering power dissipation, cycling endurance, and peripheral circuitry design.

SUMMARY OF THE INVENTION

Embodiments of systems and/or methods according to the application relate in-part to a novel tunneling barrier. In one embodiment, a tunneling barrier can include embedded monodispersive molecules in a tunnel insulating layer. In one embodiment, $C_{60}$ molecules are embedded in a tunnel insulating layer (e.g., $SiO_2$) for nonvolatile memory applications. According to exemplary embodiments, $C_{60}$ molecules are selected because of its monodispersion characteristic. $C_{60}$ molecules in the tunneling barrier provide accessible energy levels in semiconductor devices for resonant tunneling processes. In addition, $C_{60}$ molecules in the tunneling barrier are compatible with conventional semiconductor manufacturing processes (e.g., high temperatures, impinging high energy plasma, annealing processes, etc.). Further, $C_{60}$ molecules provide selectable accessible energy levels to prompt resonant tunneling through insulating $SiO_2$ at high fields, however, this process is quenched at low fields due to HOMO-LUMO gap and large charging energy of $C_{60}$. Furthermore, embodiments of system and/or methods according to the application provide charge-based nonvolatile flash memory technology and/or a field sensitive tunneling barrier that can result in an improvement of more than an order of magnitude in retention time to program/erase time ratios for a nonvolatile memory.

According to an aspect of the application, embodiments of nonvolatile memory devices include tunneling barriers that can include embedded monodispersive molecules in a tunnel insulating layer.

According to one aspect of the application, monodispersive molecules in tunneling barriers can include fullerenes such as $C_{60}$ molecules.

According to one aspect of the application, $C_{60}$ molecules can be provided with variable prescribed energy level characteristics by chemical functionalization.

According to an aspect of the application, embodiments of nonvolatile memory devices include $C_{60}$ molecules are embedded in a $SiO_2$ tunnel insulating layer to provide a tunneling barrier.

According to an aspect of the application, semiconductor devices can include a semiconductor substrate, and a nonvolatile memory cell provided on the semiconductor substrate. The nonvolatile memory cell can include a tunnel insulating film including monodispersive molecules provided on a surface of the semiconductor substrate. A charge storage layer is provided on the tunnel insulating film, an insulating film is provided on the charge storage layer, and a control electrode is provided on the insulating film.

According to an aspect of the application, semiconductor devices can exhibit increased retention time/program-erase time ratios.

According to an aspect of the application, semiconductor devices with field asymmetric tunneling processes in a tunneling barrier can be provided.

According to an aspect of the application, semiconductor devices tunnel dielectrics with prescribed characteristics can be provided by integrating molecules in hybrid molecular-silicon electronics.

In one embodiment, a semiconductor device can include a semiconductor substrate; and a nonvolatile memory cell provided on the semiconductor substrate, the nonvolatile memory cell comprising a tunnel insulating film provided over a surface of the semiconductor substrate, the tunnel insulating film comprising a layer of monodispersed molecules; a charge storage layer provided on the tunnel insulating film; an insulating film provided on the charge storage layer; and a conductive layer provided on the insulating film.

In one embodiment, a nonvolatile flash memory card can include a random access memory array; an input/output unit to operatively connect the random access memory to receive or transmit data; and a microcontroller to control data storage or data retrieval between the input/output unit and the random access memory array, wherein at least one cell of the random access memory array comprises, a semiconductor region having a source region, a drain region, and a channel region provided between the source region and the drain region, a first tunnel insulation film formed on the channel region, a barrier layer formed on the first tunnel insulation film, the barrier layer comprising a layer of monodispersed molecules, the barrier layer including a prescribed energy barrier level, a second tunnel insulation film formed on the barrier layer, a charge storage portion formed over the second tunnel insulation film, and a control electrode on the charge storage portion.

In one embodiment, a method of forming a tunnel barrier for a semiconductor device can include providing an active region at a semiconductor substrate; and providing a tunnel insulating film over the active region, wherein providing the tunnel insulating film comprises, forming a first tunnel insulation layer formed over the active region, forming a layer of conductive monodispersed fullerene molecules over the first tunnel insulation layer, and forming a second tunnel insulation layer formed over the monodispersed fullerene molecules, wherein the tunnel insulating film comprises the tunnel barrier.

Additional embodiments include a nonvolatile flash memory structure and methods for fabricating the nonvolatile flash memory structure. The nonvolatile flash memory structure in accordance with the additional embodiments includes layered over a channel region within a semiconductor substrate that separates a source region and a drain region within the semiconductor substrate: (1) a tunneling dielectric located and formed over, and typically upon, the channel region; (2) a floating gate located and formed over, and typically upon, the tunneling dielectric; (3) a blocking dielectric located and formed over, and typically upon, the floating gate; and (4) a control gate located and formed over, and typically upon, the blocking dielectric. Within the nonvolatile flash memory structure in accordance with the additional embodiments, at least one of the tunneling dielectric and the floating gate comprises at least in-part an engineered fullerene molecule. The engineered fullerene molecule is typically included at least in-part as the tunneling dielectric or the floating gate as a layer that comprises at least in-part the engineered fullerene molecule.

A method for fabricating a flash memory structure in accordance with the additional embodiments derives generally from the foregoing flash memory structure in accordance with the additional embodiments.

Within the context of the additional embodiments and the claimed invention, an "engineered fullerene molecule" is a chemically modified "neat" or "bare" fullerene molecule. An engineered fullerene molecule may include a pendent chemical groups or moieties that are bonded (i.e., typically covalently bonded) to the "neat" or "bare" fullerene molecule. These pendent chemical groups or moieties that are bonded to the "neat" or "bare" fullerene molecule are typically bonded to the outside of the engineered fullerene molecule.

By incorporating such an engineered fullerene molecule at least in part into at least one of the tunneling dielectric and the floating gate, a flash memory device in accordance with the embodiments has electrical performance properties that may be tuned predicated upon the pendent chemical groups or moieties. Moreover, in comparison in particular with neat fullerene molecules that have no pendent chemical groups or moieties, engineered fullerene molecules may be designed to be solvent soluble and readily spin-coatable from a solvent solution predicated upon particular pendent chemical groups or moieties.

Particular neat or bare base fullerene molecules that may be used in conjunction with particular pendent chemical groups or moieties to provide engineered fullerene molecules in accordance with the additional embodiments are illustrated and enumerated in further detail below within the Detailed Description of Exemplary Embodiments.

Within the description that follows and the invention as claimed, the terminology "over" is intended to mean that a layer or structure is in an overlying relationship with respect to another layer or structure, but not necessarily in contact with the other layer or structure. In contrast, the terminology "upon" is intended to mean that an overlying layer or structure contacts an underlying layer or structure.

A semiconductor structure in accordance with the additional embodiments includes a semiconductor substrate including a source region and a drain region that are separated by a channel region. The semiconductor structure also includes a tunneling dielectric located over the channel region. The semiconductor structure also includes a floating gate located over the tunneling dielectric. The semiconductor structure also includes a blocking dielectric located over the floating gate. The semiconductor structure also includes a control gate located over the blocking dielectric. Within the semiconductor structure, at least one of the tunneling dielectric and the floating gate comprises at least in-part an engineered fullerene molecule.

A method for fabricating a semiconductor structure in accordance with the embodiments includes forming a tunneling dielectric material layer over a semiconductor substrate. The method also includes forming a floating gate material layer over the tunneling dielectric material layer. The method also includes forming a blocking dielectric material layer over the floating gate material layer. The method also includes forming a control gate material layer over the blocking dielectric material layer to provide a blanket gate stack layer where at least one of the tunneling dielectric material layer and the floating gate material layer is formed at least in-part from an engineered fullerene molecule material layer. The method also includes patterning at least a portion of the blanket gate stack layer to form a gate stack. The method also includes forming a source region and a drain region separated by a channel region beneath the gate stack into the semiconductor substrate while using the gate stack as a mask.

BRIEF DESCRIPTION OF THE DRAWINGS

The features described herein can be better understood with reference to the drawings described below. The drawings are not necessarily to scale, emphasis instead generally being placed upon illustrating the principles of the invention. In the drawings, like numerals are used to indicate like parts throughout the various views.

FIG. 9A, FIG. 9B and FIG. 9C shows a series of bandgap diagrams for three exemplary flash memory experimental design structures within the first series of exemplary flash memory experimental design structures that may be fabricated in accordance with the additional embodiments in accordance with FIG. 8, as well as graph in FIG. 9D of Gate Current versus Gate Voltage for the three exemplary flash memory experimental design structures within the first series of exemplary flash memory experimental design structures.

DETAILED DESCRIPTION OF EXEMPLARY EMBODIMENTS

An exemplary process for fabricating exemplary embodiments of tunneling barriers, charge storage layers, semiconductor structures, and semiconductor devices using the same will now be described. However, embodiments of the application are not intended to be so limited as additional processes may be utilized based on the resulting tunnel barriers and charge storage layers achieving the functionality described herein.

Embodiments Using Tunneling Barriers Including Bare Fullerene Molecules

Figure 1A:
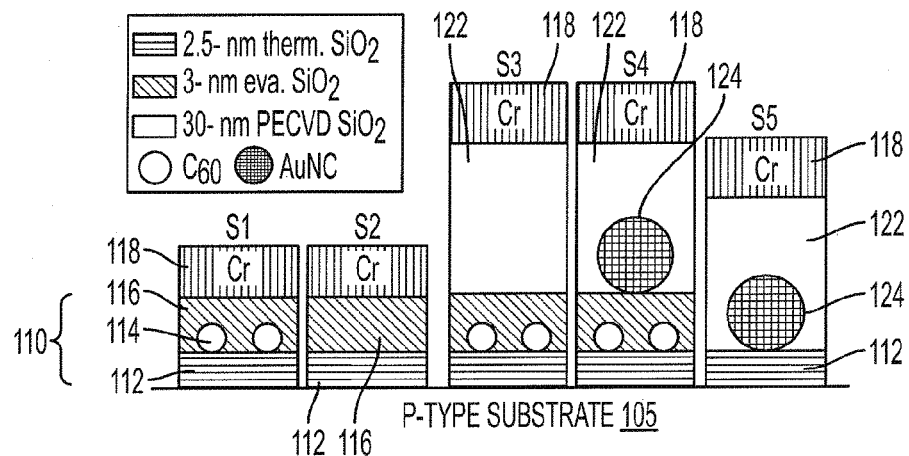
FIG. 1a is a diagram showing schematics of various exemplary heterogeneous semiconductor structures, selective ones of which include exemplary embodiments of tunneling barriers according to the application.

FIG. 1 is a diagram showing schematics of various exemplary heterogeneous semiconductor structure stacks (S1-S5), selective ones of which include exemplary embodiments of tunneling barriers according to the application. As shown in FIG. 1a, metal oxide semiconductor (MOS) capacitors with conventional local oxidation of Si (LOCOS) isolation on p-type semiconductor substrates were fabricated in one embodiment. After 2.5 nm dry thermal oxidation, $C_{60}$ molecules were thermally evaporated to a thickness of 0.4 to 0.6 nm as measured by the quartz crystal monitor, followed by $SiO_2$ evaporation of 3 nm to complete the tunneling barrier formation. The $C_{60}$ molecules were obtained commercially (i.e., MER Corporation 99.9%). The area density of $C_{60}$ molecules can be determined by electrical measurement. The area density of $C_{60}$ molecules estimated from the electrical measurement is around $2 \times 10^{12}/cm^2$.

As shown in FIG. 1a, for the metal NC memory cell structure S4, after the tunneling oxide formation on p-type semiconductor substrates, spherical Au nanocrystals (NCs) were self-assembled on the oxide by the electron beam evaporation of 1.2 nm Au without annealing. $SiO_2$ control oxide was deposited by plasma enhanced chemical vapor deposition (PECVD) to a thickness of 30 nm. Finally, a top Cr gate was patterned, followed by 400° C. forming gas annealing for 30 minutes.

Exemplary experimental results provided by the heterogonous semiconductor structure stacks S1-S5 (e.g., gate stacks S1-S5) are described herein and illustrated in FIG. 1a. As shown in FIG. 1a, the stack S1 includes an embodiment of a tunneling oxide formation 110 including a first insulating layer 112 and a second insulating layer 116 including a conductive monodispersive molecule layer 114 of $C_{60}$ molecules therebetween formed on substrate 105 (e.g., p-type substrate). The substrate 105 can include source regions and drain regions (not shown) adjacent the stacks S1-S5. A conductive layer 118 of metal (e.g., Cr) over the tunneling oxide formation 110 can be formed as a gate electrode for the stack S1. The stack S2 includes the first insulating layer 112, the second insulating layer 116, and the conductive layer 118 formed on the substrate 105.

As shown in FIG. 1a, the stack S3 includes the tunneling oxide formation 110 on the substrate 105 (e.g., p-type substrate). A third insulating layer 122 of $SiO_2$ is formed over the tunneling oxide formation 110 and below the conductive layer 118. The stack S4 includes a charge storage layer 124 of spherical Au NC between the tunneling oxide formation 110 and the third insulating layer 122. The charge storage layer 124 and third insulating layer 122 can function as a floating gate and floating insulating layer, respectively. Further, the stack S5 includes the first insulating layer 112, the charge storage layer 124, the third insulating layer 122, and the conductive layer 118 formed on the substrate 105.

Figure 2:
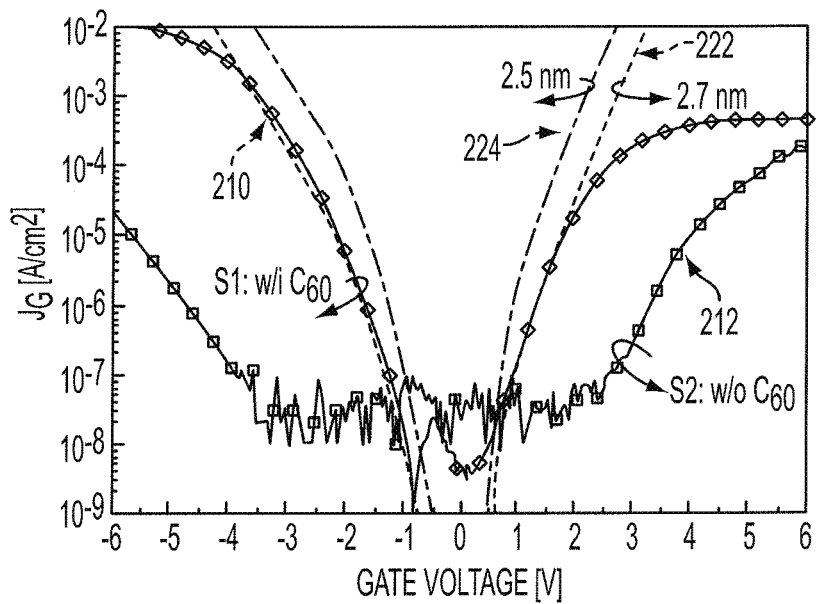
FIG. 2 is a diagram that shows exemplary gate current characteristics for a tunneling barrier embodiment according to the application and a control structure.

FIG. 2 is a diagram that shows increased gate current using an embodiment of tunneling barriers according to the application. The control sample or the stack S2 without the $C_{60}$ layer is shown for comparison. As shown in FIG. 2, gate current 210 through the stack S1 is increased relative to the gate current 212 through the stack S2. The gate current 210 through the stack S1 uses an exemplary $C_{60}$ embedded layer 114. Again, the stack S1 consists of tunneling oxide (e.g., 2.5 nm thermal $SiO_2$+$C_{60}$+3 nm evaporated $SiO_2$) but not top layers of Au NC and PECVD $SiO_2$. As shown in FIG. 2, the stack S1 shows exponential gate current 210 increase by four orders of magnitude caused by resonant tunneling through the molecular levels of $C_{60}$ of the tunneling oxide formation 110. The $C_{60}$ molecules in layer 114 are closer to the channel and can have a larger and more controllable density than evaporated $SiO_2$ traps.

As shown in FIG. 2, the gate current saturation above +/−3 V is limited by high substrate resistance and insufficient minority carrier generation under inversion. Since these field conditions are very far away from those in normal memory operations, the results shown in FIG. 2 are satisfactory to demonstrate the resonant tunneling effect of the layer 114. In addition, theoretical tunneling current calculation by the Wentzel-Kramer-Brillouin (WKB) approximation (222, 224) is shown in FIG. 2 to compare with the experimental data from the stack S1 and the stack S2. The gate current 210 from the stack S1 agrees well with a gate current 222 from an ideal theoretical 2.7 nm $SiO_2$ barrier. The gate current 210 from stack S1 is only ten times smaller than the calculated WKB theoretical gate current 224 for a single layer of 2.5 nm $SiO_2$ despite much thicker physical thickness provided by the top $C_{60}$ and evaporated $SiO_2$ layers (e.g., layers 114, 116).

Figure 1B:
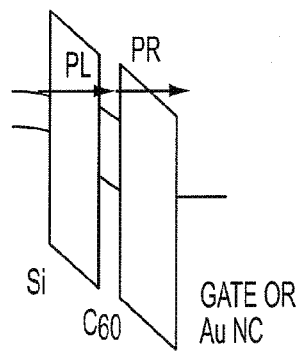
FIGS. 1b-1c are diagrams showing respective energy band level diagram representations of tunneling barriers resonant tunneling through $C_{60}$ under high electric field and tunnel barriers direct tunneling through $C_{60}$ under low electric field according to exemplary embodiments of tunneling barriers (e.g., S1, S3, S4) of the application.
Figure 1C:
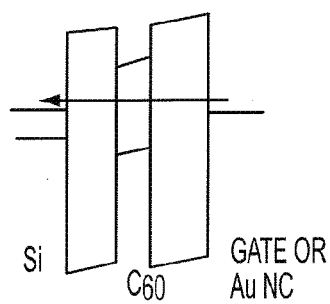

FIGS. 1b-1c are diagrams that show energy band level diagram representation of tunneling barriers resonant tunneling using $C_{60}$ (e.g., under electric fields) and tunnel barriers direct tunneling using $C_{60}$ (e.g., under low electric fields for layer 114). An exemplary energy band level diagram of the $C_{60}$ embedded barrier under high bias conditions, such as program operations, is illustrated in FIG. 1b. The HOMO-LUMO gap (highest occupied molecular orbital, lowest unoccupied molecular orbital) of $C_{60}$ is about 1.64 eV with HOMO and LUMO levels being five fold and three fold degenerate, respectively. Further, the specific energy level alignment with the bands of the surrounding dielectrics is determined by interface dipole formation and redox states of $C_{60}$ at thermal equilibrium. Under sufficient external bias, resonant tunneling through $C_{60}$ energy levels is enabled because the energy of injected electrons from the Si channel exceeding the $C_{60}$ energy levels and Coulomb charging energy. A two step tunneling process can describe the observed experimental results to the first order. The two step tunneling current density J in the weak coupling regime with accessible energy levels provided by the intermediate $C_{60}$ molecules can be expressed as equation (1) below:

$$J = \sum_{E=E_a}^{\infty} qC(E)N_t\sigma_t \frac{P_L(E)P_R(E)}{P_L(E)+P_R(E)} \quad \text{Eq. (1)}$$

where $N_t$ is the density of $C_{60}$, $\sigma_t$ is the effective capture cross section of $C_{60}$, $P_L$ and $P_R$ are the tunneling probabilities through the left and right oxide barriers, C is the electron source function of the channel. The summation in equation (1) takes into account all electrons with energy higher than the first accessible energy level of $C_{60}$ molecules $E_\alpha$. Here it can be assumed that the occupancy factors are 1 and 0 for the conduction band electron states in the channel and gate, respectively. In FIG. 2, the similarity of J-V shapes between the 2.5 nm $SiO_2$ and the $C_{60}$ embedded barrier implies J is mainly controlled by the left barrier, e.g., PL<<PR. This is because bulk traps in the evaporated $SiO_2$ can enhance $P_R$ (e.g., significantly or greatly) through the trap assisted tunneling process. Very high $C_{60}$ density with a reasonable $\sigma_t$=5× $10^{-14}$ cm$^2$ can account for the ten times current reduction in the results in comparison with the single layer of 2.5 nm $SiO_2$. On the contrary, under low bias conditions, the resonant tunneling is largely reduced or forbidden due to both the $C_{60}$ HOMO-LUMO gap and the Coulomb charging energy as shown in FIG. 1c. The direct tunneling current can be extremely low for a thick barrier and was evaluated through the retention measurement in the memory cell described below. In an actual implementation, the trap assisted tunneling through the interface states between $C_{60}$ and $SiO_2$ and the bulk traps in evaporated $SiO_2$ can lead to higher current. Further, design optimization for an increased or a maximum tunneling asymmetry may be possible by engineering the HOMO-LUMO gap and charging energy of different molecules as well as the dielectric thickness.

Figure 3:
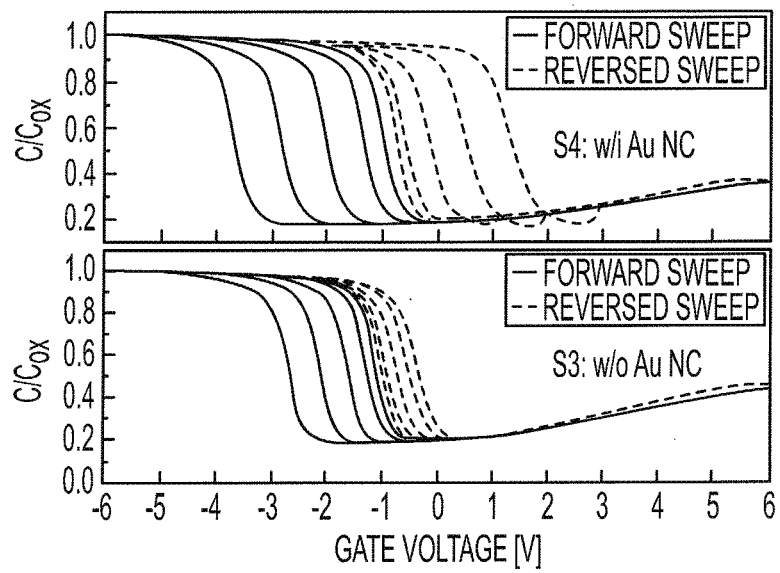
FIG. 3 is a diagram that shows high frequency CV sweeps for semiconductor structure stacks (e.g., memory cells) without the Au NC layer and with the Au NC layer, respectively, and including an exemplary $C_{60}$ embedded tunneling barrier embodiment.

FIG. 3 is a diagram that shows high frequency CV sweeps for semiconductor structure stacks, (e.g., memory cells) without the Au NC layer and with the Au NC layer. Both S3 and S4 include an exemplary $C_{60}$ embedded tunneling barrier embodiment. The high frequency capacitance voltage (CV) sweeps with increasing range from +/−2 V to +/−6 V are shown in FIG. 3 for the stack S3 without the Au NC layer S3 and for the stack S4 with the Au NC layer. Both the stacks S3 and S4 include the $C_{60}$ embedded tunneling barrier 110. In a separate control sample without both $C_{60}$ and Au NC but with all other dielectric layers, no hysteresis is observed under the same sweep range. In the stack S3, larger negative flat band shifts ($\Delta V_{FB}$) demonstrate the preferable hole storage at monoanion $C_{60}^{1-}$ and the higher charge neutrality level (CNL) of interface states between $C_{60}$ and $SiO_2$. In the stack S4, much larger and symmetric flat band shifts ($\Delta V_{FB}$) clearly demonstrate that both electron and hole can indeed be injected into the upper Au NCs through the resonant tunneling modes provided by $C_{60}$. Thus, the stack S3 and the stack S4 demonstrate with selected tunneling injection structure the memory window (e.g., charge stored, voltage shift) can be enhanced.

Figure 4:
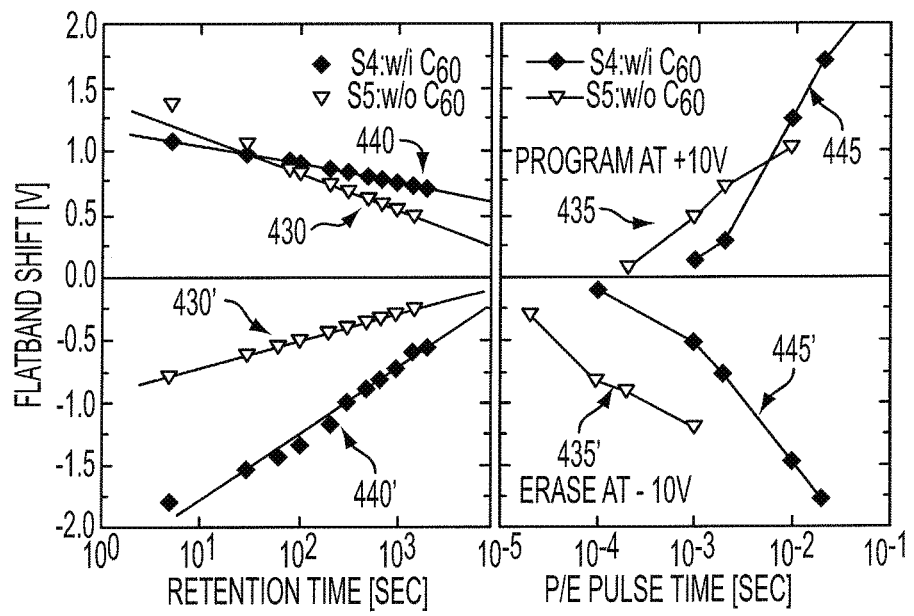
FIG. 4 is a diagram that shows retention and P/E characteristics of an exemplary embodiment of metal NC memories, (e.g., S4) with a composite barrier of 2.5 nm thermal $SiO_2$+$C_{60}$+3 nm evaporated $SiO_2$. For consistent initial conditions, the preset bias prior to the retention and P/E measurements can be +/−5 V for 3 sec.

FIG. 4 is a diagram that shows exemplary retention time characteristics and program/erase time characteristics for semiconductor structures using embodiments of tunneling barriers according to the application. As shown in FIG. 4, the retention and P/E characteristics of a metal NC memory cell with a single layer of 2.5 nm $SiO_2$ in the stack S5 are compared with the stack S4 including the tunnel barrier 110. The stack S4 has longer retention 440, 440' due to the lower escape rate of thermally excited electrons and holes in Au NCs through a physically thicker barrier provided by the additional $C_{60}$ and top $SiO_2$ layers than the retention time 430, 430' of the stack S5. This is more pronounced for electron storage with at least two orders of magnitude improvement in the extrapolated retention time. The improvement in rejection time is likely due to the suppression of trap assisted tunneling of electrons with the high CNL at the $C_{60}/SiO_2$ interface. The P/E speed 445, 445' at +/−10 V in the stack S4 is only about ten times slower than the P/E speed 435, 435' at +/−10 V for the stack S5, which is in close agreement with the tunneling current results shown in FIG. 2. Even though the P/E voltage results have not yet been optimized, which is expected to scale by improving the coupling ratio with either a thinner or a higher-K control oxide, improved $t_R/t_{PE}$ ratio by at least an order is shown with the field sensitive $C_{60}$ embedded tunneling barrier in FIG. 4. Further, improvement in the results can be achieved by reducing the non-ideal effects by the $C_{60}/SiO_2$ interface states and/or the bulk traps in the evaporated $SiO_2$.

Figure 5:
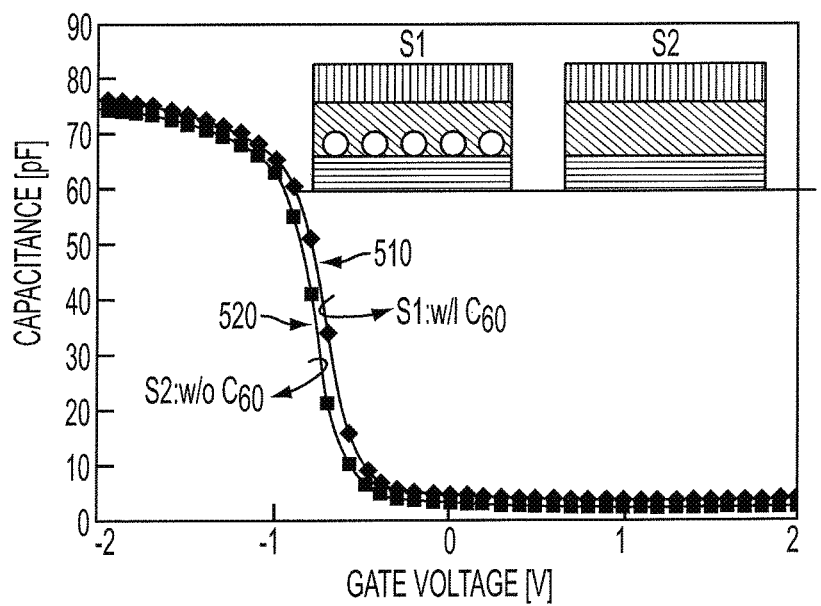
FIG. 5 is a diagram that shows exemplary C-V characteristics of exemplary semiconductor structures, one of which includes an embodiment of a tunneling barrier according to the application.

FIG. 5 is a diagram that shows exemplary C-V characteristics of exemplary semiconductor structures according to the application. As shown in FIG. 5, a C-V sweep 510 for the stack S1 and a C-V sweep 520 for the stack S2 show that the structures do not retain charge (e.g., a negligible memory window). Thus, embodiments of a tunnel barrier 110 do not operate to store a charge.

Embodiments according to the application provide implementations of tunnel barriers by utilizing the monodispersion characteristic of exemplary nanoscale entities. Embodiments provide the first or novel demonstration of molecule engineered tunneling barriers in semiconductor (e.g., Si) devices. Exemplary nanoscale entities include monodispersive molecules such as but not limited to fullerene molecules or $C_{60}$ molecules. In addition, embodiments of tunneling barriers or semiconductor structures including the same can provide consistent and/or accurate control of $C_{60}$ molecule size or monodispersive molecule size throughout (e.g., even at a wafer level). Embodiments according to the application can provide $C_{60}$ molecules with variable prescribed energy level characteristics by chemical functionalization. In one embodiment, metal molecules (e.g., $C_0$, W, Zr) can be embedded in the $C_{60}$ molecules to modify energy level(s). Embodiments according to the application provide implementations of a double tunnel junction by utilizing a monodispersion implementation of exemplary nanoscale entities. Further, embodiments provide an increased or improved $t_R/t_{PE}$ ratio in a memory integrated with inventive tunneling barrier. In one embodiment, $C_{60}$ molecules in the tunneling barrier provide accessible energy levels in semiconductor devices for resonant tunneling processes. In addition, $C_{60}$ molecules in the tunneling barrier are compatible with conventional semiconductor manufacturing processes (e.g., high temperatures, high energy plasma impinging, annealing processes, etc.).

In one embodiment, exemplary tunneling barriers include a first insulating layer, a layer of monodispersive conductive molecules and a second insulating layer. The first insulating layer and the second insulating layer can be, for example, 0.5 nm, 1 nm, 2 nm, 3 nm or more than 5 nm thick. In one embodiment, the monodispersive conductive molecules layer can be less than 0.5 nm thick, 1 nm thick, 1.2 nm thick, 3 nm thick, 5 nm thick, 10 nm thick and can comprise $C_{60}$ molecules. Exemplary semiconductor structures can include such tunneling barriers. Exemplary memory cells or circuits can add stacked charge storage layers, a third insulating layer, a conductive layer or electrode over the tunneling barriers, and source and drain electrodes.

Figure 6:
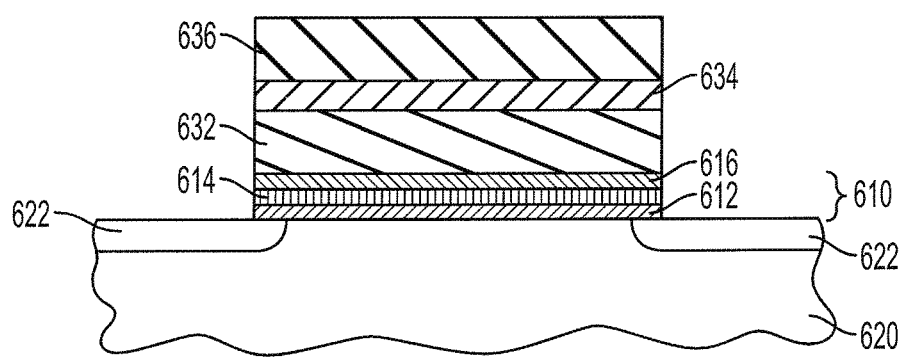
FIG. 6 is a diagram that shows a cross-sectional view of an exemplary embodiment of a nonvolatile semiconductor memory device according to the application.

FIG. 6 is a diagram that shows a cross-sectional view of an exemplary embodiment of a nonvolatile semiconductor memory device according to the application. First of all, as shown in FIG. 6, tunnel insulating film 610 can include a first tunnel insulating film (e.g., silicon oxide film) 612, a layer of conductive molecules 614 exhibiting a monodispersion characteristic, and a second tunnel insulating film (e.g., silicon oxide film) 616. The first tunnel insulating film 612 can be formed on or over a semiconductor substrate (e.g., silicon substrate) 620. The layer of conductive molecules 614 exhibiting a monodispersion characteristic can be fullerene molecules such as, but not limited, to a $C_{60}$ layer of molecules.

A charge storage portion (e.g., floating gate) 632 can be over the tunnel insulating film 610. In one embodiment, the charge storage portion can include metal NC particles. Alternatively, the charge storage portion can include a conductive layer, a polysilicon, silicon-rich silicon nitride film (e.g., formed by known processes using selected source gas ratios or the like). A control insulation film 634 and control gate electrode 636 can be over the charge storage portion 632.

A mask (e.g., resist pattern), for example, can be used to pattern a control gate electrode layer, a control insulation layer, a charge storage layer, a tunnel insulation film (e.g., dielectric, $C_{60}$ molecules, dielectric) to form the stacked structure shown in FIG. 6. Thereafter, impurities (e.g., n-type) can be ion-implanted into the substrate 620 (e.g., p-type) and an optional annealing process can provide highly doped impurity diffusion layer 622, which can serve as the source region (e.g., first electrode) and the drain region (second electrode).

In this way, a floating gate type memory device can be obtained as shown in FIG. 6. In the floating gate type memory device, it is possible to bring in and out the information charge to and from the charge storage portion (e.g., traps of a floating gate) 632 via embodiments of the tunnel insulation film including the monodispersive molecule layer, which can form a double tunnel junction under the control of the control gate electrode 636.

Operations to write, read, and erase information for the floating gate type memory device as shown in FIG. 6 will now be described. Briefly summarized, information can be written by injecting electrons into the charge storage portion 632 (e.g., floating gate). For example, by applying the positive voltage to the control gate electrode 636, carrier electrons in the inversion layer formed in the silicon substrate 620 surface can be injected into the charge storage portion 632 (e.g., traps) via the tunnel barrier 610. Information can be read by discriminating quantity of drain current that complies with presence or absence of stored charges. Stored charges can be discharged by allowing the stored charges to tunnel to the silicon substrate 620 via the tunnel barrier 610 (e.g., with the $C_{60}$ layer interdispersed therein) by applying negative voltage to the control gate electrode 636. Since information write, read, and erase operations are similar as those in the related art, a detailed description is omitted here.

By taking advantages of versatile and tunable molecular properties according to embodiments of the application, integration of molecules in Si-based devices can provide a way to tailor tunneling dielectric properties. Although metal NC memory were disclosed herein, tunneling barrier embodiments according the application can be applied for other charge based memories such as, but not limited to conventional NAND Flash, Si NC, SONOS memories, and MONOS memories.

In addition, in exemplary embodiments, the semiconductor structures, tunneling barrier, and floating gate memories based on N-type structures are described, but embodiments according to the application can be applied to P-type structures.

Related art metal nanocrystal (NC) memory has been proposed to enhance the tunneling asymmetry. For example, a double tunnel junction structure consisted of a layer of about 1-nm Si NCs sandwiched between two $SiO_2$ layers where the Si NCs were crystallized by annealing a $SiO_2$/a-Si/$SiO_2$ structure. The size of NCs plays a role in the double tunnel junction performance. However, size variation of the Si NC cannot be controlled and can cause reproducibility issues such as device variation within a memory array.

Further, in exemplary embodiments, tunnel barriers can be considered a double tunnel junction provided between two tunnel insulation films. However, the multiple tunnel junction may be adopted in which a layer of monodispersive molecules and the tunnel insulation film are alternately stacked and charge and discharge may be carried out via a multiple tunnel junction.

According to exemplary embodiments described herein, memory devices implementing 1 bit per cell can be provided. However, embodiments are not intended to be so limited as multi-bit memory devices or cells can be provided using embodiments of tunneling barriers.

The tunnel insulating layers can be formed by various conventional processes including, for example, thermal oxidation process, CVD processes, LPCVD processes, PECVD processes, or the like. The tunnel insulating layers can use conventional materials for flash memory technology such as silicon oxide or dielectrics (e.g., hafnia, alumina, or combinations thereof). Further, in exemplary embodiments, conventional materials for flash memory technology such as metal NC, metal layers, Si-rich silicon nitride film, silicon oxide film, can be used for the floating gate (charge storage portion).

Embodiments according to the application can include memory cell arrays, which can constitute a NAND flash memory or the like. For example, embodiments of systems and/or methods according to the application can be used for semiconductor devices adapted for use in electronic equipment, such as but not limited to SSD, notebook computers, portable computer, PDAs, telephones, cameras, music playback devices, which can be equipped with memory. Embodiments according to the application can be a memory cell including a tunnel insulating film, a floating gate electrode, a control gate electrode, an interelectrode (i.e., blocking dielectric) insulating film, and source/drain regions.

Nonvolatile Flash Memory Structures Including Engineered Fullerene Molecules

In accordance with the Summary described above, a flash memory structure in accordance with additional embodiments also includes at least one engineered fullerene molecule incorporated at least in-part within at least one of a tunneling dielectric and a floating gate within the flash memory structure. By including such an engineered fullerene molecule at least in-part within at least one of the tunneling dielectric and the floating gate, a flash memory device that derives from operation of the flash memory structure in accordance with the embodiments may be fabricated with tunable chemical and electrical performance properties and characteristics, since the engineered fullerene molecule may be engineered to include any of several types of pendent chemical groups or moieties as are commercially available, or may be synthesized, to provide the engineered fullerene molecule with particular chemical properties that in turn provide a flash memory structure with particular electrical performance characteristics. The particular electrical performance characteristics provide superior performance in comparison with flash memory structures that use in the alternative neat fullerene molecules that are not "engineered" within the context of the embodiments, and thus do not have any pendent chemical groups or moieties.

The detailed description that follows will first describe a generalized flash memory structure in accordance with the additional embodiments and a method for fabricating the generalized flash memory structure in accordance with the additional embodiments. The detailed description that follows will next describe specific experimental details regarding exemplary flash memory experimental design structures in accordance with the additional embodiments.

General Flash Memory Structure and Method for Fabrication

Figure 7A:
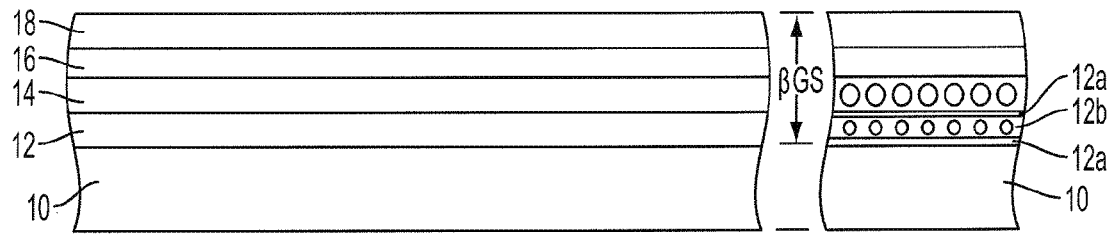
FIG. 7A, FIG. 7B and FIG. 7C show a series of schematic cross-sectional diagrams illustrating the results of progressive process stages in fabricating a flash memory structure in accordance with the additional embodiments.
Figure 7B:
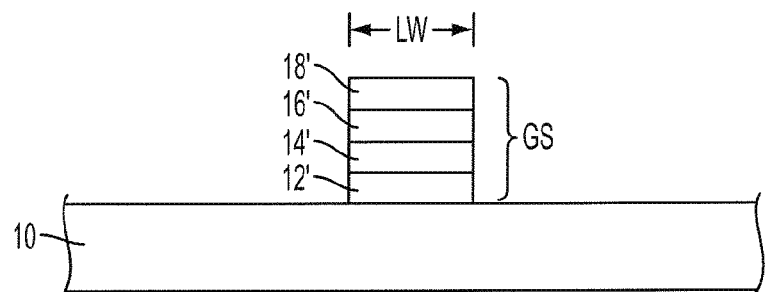
Figure 7C:
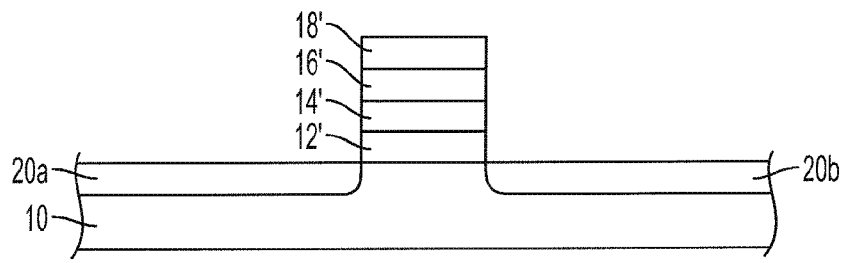

FIG. 7A, FIG. 7B and FIG. 7C show a series of schematic cross-sectional diagrams illustrating the results of progressive process stages in fabricating a general flash memory structure in accordance with the additional embodiments. FIG. 7A shows a schematic cross-sectional diagram of the general flash memory structure at an early stage in the fabrication thereof in accordance with the additional embodiments.

FIG. 7A first shows a semiconductor substrate 10. A tunneling dielectric material layer 12 is located and formed upon the semiconductor substrate 10. A floating gate material layer 14 is located and formed upon the tunneling dielectric material layer 12. A blocking dielectric material layer 16 (i.e., a control dielectric material layer) is located and formed upon the floating gate material layer 14. Finally, a control gate material layer 18 is located and formed upon the blocking dielectric material layer 16.

As will be discussed in further detail below, and in accordance with the additional embodiments, at least one, and optionally both, of the tunneling dielectric material layer 12 and the floating gate material layer 14 comprises at least in-part an engineered fullerene molecule. Under circumstances where both the tunneling dielectric material layer 12 and the floating gate material layer 14 comprise an engineered fullerene molecule (or engineered fullerene molecule layer), different engineered fullerene molecules are common for the tunneling dielectric material layer 12 and the floating gate material layer 14.

Within the flash memory structure whose schematic cross-sectional diagram is illustrated in FIG. 7A, the semiconductor substrate 10 comprises a semiconductor material that is otherwise generally conventional in the semiconductor fabrication art. Such semiconductor materials may include, but are not necessarily limited to, silicon semiconductor materials, germanium semiconductor materials, silicon-germanium alloy semiconductor materials and compound semiconductor materials. Typically and preferably the semiconductor substrate 10 comprises a silicon semiconductor substrate of either a p or an n dopant type.

The tunneling dielectric material layer 12 and the blocking dielectric material layer 16 may under circumstances where the tunneling dielectric material layer 12 does not comprise an engineered fullerene molecule comprise any of several dielectric materials, including but not limited to silicon oxide dielectric materials, silicon nitride dielectric materials and silicon oxynitride dielectric materials, as well as laminates and composites of silicon oxide dielectric materials, silicon nitride dielectric materials and silicon oxynitride dielectric materials. Typically and preferably, under such circumstances, each of the tunneling dielectric material layer 12 and the blocking dielectric material layer 16 comprises a silicon oxide dielectric material. Commonly, the tunneling dielectric material layer 12 has a thickness from about 1 to about 10 nanometers and the blocking dielectric material layer 16 has a thickness from about 1 to about 10 nanometers.

In addition, the tunneling dielectric material layer 12 and the blocking dielectric material layer 16 may each be formed using methods and materials that are otherwise also generally conventional in the semiconductor fabrication art. In particular, the tunneling dielectric material layer 12 may be formed using a thermal oxidation method to provide a silicon oxide tunneling dielectric material layer 12 when the semiconductor substrate 10 comprises a silicon semiconductor substrate. Moreover, the tunneling dielectric material layer 12 and the blocking dielectric material layer 16 may both be formed using a chemical vapor deposition method or physical vapor deposition method using appropriate source materials.

Similarly, the floating gate material layer 14 and the control gate material layer 18 may under circumstances where the floating gate material layer 14 does not comprise an engineered fullerene molecule, both comprise any of several conductor materials that are otherwise generally conventional in the semiconductor fabrication art. Such conductor materials may include, but are not necessarily limited to, metal, metal alloy, doped polysilicon (i.e., having a dopant concentration greater than about 1E18 dopant atoms per cubic centimeter) and polycide (i.e., doped polysilicon/metal silicide stack) conductor materials.

Typically and preferably, the floating gate material layer 14 comprises a gold nanocrystalline material that has a nanocrystal size from about 1 to about 10 nanometers monodisperse or polydisperse in that range, and a thickness from about 1 to about 10 nanometers. Typically and preferably, the control gate material layer 18 comprises a laminate of a metal adhesion layer and a metal layer.

Within the context of the embodiments when the tunneling dielectric material layer 12 comprises an engineered fullerene material, the engineered fullerene material is typically and preferably incorporated into the tunneling dielectric material layer 12 as a central core layer 12b that separates two tunneling dielectric material layers 12a, as is further illustrated at the right hand side of FIG. 7A. Under such circumstances, the two separate tunneling dielectric material layers 12a provide a double tunnel barrier (i.e., a resonant tunnel barrier) in comparison with a single (i.e., a conventional) tunnel barrier that is provided when the tunneling dielectric material layer 12 includes only a single dielectric material.

In contrast, when the floating gate material layer 14 comprises an engineered fullerene molecule, the engineered fullerene molecule typically comprises the entire thickness of the floating gate material layer 14, as is also illustrated in FIG. 7A at the right hand side.

FIG. 7B shows a schematic cross-sectional diagram illustrating the results of further processing of the flash memory structure whose schematic cross-sectional diagram is illustrated in FIG. 7A.

FIG. 7B shows the results of sequentially patterning the control gate material layer 18, the blocking dielectric material layer 16, the floating gate material layer 14 and the tunneling dielectric material layer 12 to provide a gate stack GS that includes a tunneling dielectric 12' located and formed upon the semiconductor substrate 10, a floating gate 14' located and formed upon the tunneling dielectric 12', a blocking dielectric 16' located and formed upon the floating gate 14' and a control gate 18' located and formed upon the blocking dielectric 16'.

The foregoing patterning of the control gate material layer 18, the blocking dielectric material layer 16, the floating gate material layer 14 and the tunneling dielectric material layer 12 to form the gate stack GS that comprises the tunneling dielectric 12' located and formed upon the semiconductor substrate 10, the floating gate 14' located and formed upon the tunneling dielectric 12', the blocking dielectric 16' located and formed upon the floating gate 14' and the control gate 18' located and formed upon the blocking dielectric 16' may be effected using methods and materials that are otherwise generally conventional in the semiconductor fabrication art. Such methods and materials will typically include, but are not necessarily limited to, photolithographic and etch methods and materials. Such photolithographic and etch methods and materials will typically use: (1) chlorine containing etchant gas compositions for etching silicon material layers and metal material layers; and (2) fluorine containing etchant gas compositions for etching dielectric material layers containing dielectric materials such as but not limited to silicon oxide dielectric materials, silicon nitride dielectric materials and silicon oxynitride dielectric materials.

Typically and preferably, the gate stack GS will have a conventional and scalable linewidth LW, as is illustrated in FIG. 7B. Moreover, while FIG. 7B illustrates the gate stack GS as comprising the four component layers 12', 14', 16' and 18' as co-extensive with aligned sidewalls, such is not necessarily required within the embodiments insofar as the tunneling dielectric material layer 12 need not necessarily be patterned to form the tunneling dielectric 12'. As well, the embodiments also contemplate additional gate stack GS structures where additional component layers of the component layers 12', 14', 16' and 18' need not necessarily be co-extensive with aligned sidewalls.

FIG. 7C shows the results of further processing of the flash memory structure whose schematic cross-sectional diagram is illustrated in FIG. 7B.

FIG. 7C shows the results of locating and forming a source region 20a and a drain region 20b into the semiconductor substrate 10 at regions separated by the gate stack GS, while leaving a channel region within the semiconductor substrate beneath the gate stack GS. The source region 20a and the drain region 20b are each typically of a dopant type opposite the semiconductor substrate 10. The flash memory structure whose schematic cross-sectional diagram is illustrated in FIG. 7C is typically formed from the flash memory structure whose schematic cross-sectional diagram is illustrated in FIG. 7B while using an ion implantation method that in turn uses an appropriate ion implantable dopant at an appropriate ion implantation energy and an appropriate dopant dose, to locate and form the source region 20a and the drain region 20b into the semiconductor substrate 10 separated by the gate stack GS.

To better understand the additional embodiments, it is again noted that the additional embodiments primarily include a gate stack GS design which includes an engineered fullerene molecule (i.e., as an engineered fullerene molecule material layer) included at least in-part within at least one of the tunneling dielectric 12' and the floating gate 14'.

When the engineered fullerene molecule is located and formed within the tunneling dielectric 12', the engineered fullerene molecule is initially formed as an engineered fullerene molecule material layer 12b located and formed interposed between separated tunneling dielectric material layers 12a as is illustrated within the schematic cross-sectional diagram of FIG. 7A. Under such circumstances, each of the separated tunneling dielectric material layers 12a may still comprise any of the several tunneling dielectric materials that are disclosed above within the context of description of the tunneling dielectric material layer 12. In addition, and also under the same circumstances, the engineered fullerene molecule material layer 12b will have a thickness from about 1 to about 10 nanometers.

When the engineered fullerene molecule is located and formed including a total thickness of the floating gate 14', an engineered fullerene molecule material layer includes completely the floating gate material layer 14 that is illustrated within FIG. 7A. Thus, within this circumstance the engineered fullerene molecule material layer is located and formed upon the tunneling dielectric material layer 12 to a thickness from about 1 to about 10 nanometers.

Within the context of the embodiments, engineered fullerene molecules exhibiting a range of HOMO/LUMO (i.e., highest occupied molecular orbital/lowest unoccupied molecular orbital) energy bandgap states or redox states are desirable as at least part of the tunneling dielectric 12' and/or the floating gate 14' for geometric and voltage scaling, particularly in sub-45 nm flash memory structures. Given their possible multifunctional nature, engineered fullerene molecules may exhibit uniquely favorable characteristics for this application in comparison with neat or bare fullerene molecules that do not have any pendent chemical groups or moieties, which may include, but are not limited to $C_{60}$, $C_{70}$ and $C_{84}$ neat fullerene molecules. The distinct advantages of engineered fullerene molecules as a class of molecules stems from the modification of their electronic properties due to tailored chemical derivatization.

Some of the engineered fullerene molecules that are relevant within the context of the embodiments are embraced by the chemical formula $C_nR_m$, with: (1) n including but not limited to 60, 70, 76, 78, 84; and (2) m between 1 and 48. R can be a hydrogen, halogen, —OH, —CN, aromatic or alkyl group radical, substituted or not. Possible substitutions include alcohol, aldehyde, ketone, carboxylic acid, ester, ether, sulfur or nitrogen-containing radical units. R can be attached to two carbon atoms of a fullerene cage leading to cyclic structures consisting of 3 to 7 atoms. Synthesis methods include nucleophilic additions, [4+2], [3+2], [2+2], [2+1] cycloadditions, additions of carbenes, nitrenes, silylenes, reactions with diazonium salts and radical additions. Other pertinent engineered fullerene molecules include endohedral engineered fullerene molecules and fullerene-transition metal complexes that include bonding within the context of a pendant chemical group or moiety.

Moreover, the R group described above can be of electron withdrawing characteristics or of electron donating characteristics, and thus provide a means to alter a HOMO level, a LUMO level or both the HOMO level and the LUMO level, as well as the HOMO/LUMO electronic gap, within an engineered fullerene molecule and thus electronically influence either one or both of the tunneling dielectric 12' and the floating gate 14'.

Dimensional uniformity and mono-dispersity of the engineered fullerene molecules in accordance with the embodiments provide for the dimensional uniformity needed at nanoscale device architectures and eliminates the voltage variations that arise therein. In this respect the engineered fullerene molecules in accordance with the embodiments are similar to the neat fullerene molecules which include, but are not limited to $C_{60}$, $C_{70}$ and $C_{84}$.

The electrical conductivity and the redox capability of the engineered fullerene molecules to provide a tunnel asymmetry required for a double tunnel junction in a non-volatile memory device is dependent upon the intrinsic electronic structure of the engineered fullerene molecules. In this respect the engineered fullerene molecules provide an advantage over the neat or bare fullerenes $C_{60}$, $C_{70}$ and $C_{84}$ by providing a molecular template base structure neat fullerene along with a tunable electronic structure that derives from the pendant chemical groups or moieties.

Due to the tunable electronic structure, the engineered fullerene molecules provide for a tunable electrical response of the engineered fullerene molecules under bias to thus help to alter the electronic states to function either as a resonant double tunnel barrier junction at higher bias or a conventional direct tunnel barrier junction under low bias within a particular flash memory structure.

More importantly, the structural chemical designs and solubility enhancements possible in an engineered fullerene molecule provide many advantages over the neat fullerene $C_{60}$, $C_{70}$ and $C_{84}$ molecules and allow low temperature, solvent based device integration of the engineered fullerene molecules into particular flash memory structures.

Particular illustrative and non-limiting engineered fullerene molecules that are used within a tunneling dielectric or a floating gate in accordance with experimental details that follow include $C_{60}$—PCBM and $C_{70}$—PCBM, where PCBM is [6,6]-phenyl-C61-butyric acid methyl ester.

Experimental Details

The asymmetry between retention time $t_R$ and program/erase (P/E) time $t_{PE}$ in a double tunnel barrier flash memory device is closely related to the energy level position of an engineered fullerene molecule relative to a silicon semiconductor substrate in the double tunnel barrier flash memory device. Experimental simulations of gate current versus gate voltage (I-V) were performed to understand the relationship between flash memory device performance for different engineered fullerene molecules.

Figure 8:
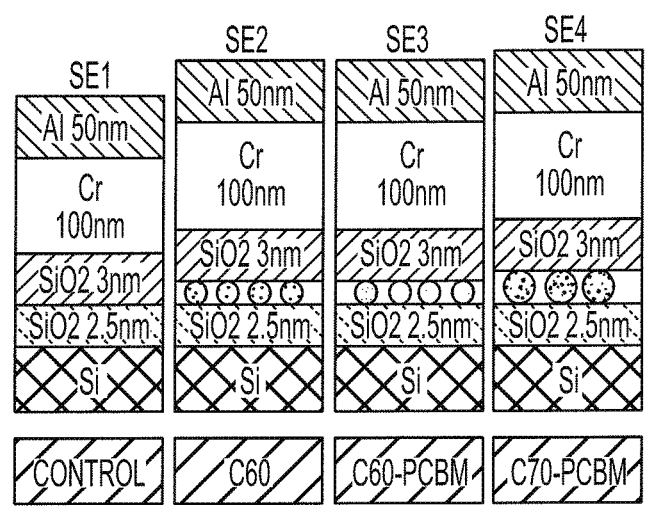
FIG. 8 shows a first series of exemplary flash memory experimental design structures that may be fabricated in accordance with the additional embodiments.

The exemplary flash memory experimental design structures used for simulating the foregoing gate current versus gate voltage electrical characteristics are shown in FIG. 8 and designated as SE1, SE2, SE3 and SE4. These exemplary flash memory experimental design structures resemble a metal-oxide-semiconductor (MOS) capacitor structure fabricated including a p-type silicon semiconductor substrate as the semiconductor component. Thin layers of $C_{60}$ neat fullerene molecules, or alternatively $C_{60}$—PCBM or $C_{70}$—PCBM engineered fullerene molecules, were embedded between 2.5 nanometers of a thermal silicon oxide as the first tunneling barrier layer and another 3 nanometers of a deposited silicon oxide as the second tunneling barrier layer. A work function of the control gate (i.e., 50 nanometers aluminum located and formed upon 100 nanometers of chromium) used in the simulation was either: (1) fixed at the Fermi-level of the silicon semiconductor substrate (i.e., a fixed control gate) to avoid a control gate to substrate work function difference; or (2) varied slightly according to characteristics of the embedded engineered fullerene molecule to fix an initial flatband voltage at roughly the same point for the control gate to semiconductor substrate for easier comparison (i.e., a variable control gate).

The simulation was performed by extracting the metal-oxide-semiconductor type device electrostatics characteristics using a three-dimensional finite element analysis method. The data that was obtained from the method was incorporated into a one-dimensional Wentzel-Krammers-Brillouin (WKB) function to solve for the relevant tunneling current.

The electronic bandgap structures for the silicon semiconductor substrate/silicon oxide tunneling dielectric/engineered fullerene molecule portions of the layered structures, including the differences between the LUMO levels of $C_{60}$, $C_{60}$—PCBM and $C_{70}$—PCBM, are illustrated in FIG. 9A, FIG. 9B and FIG. 9C respectively. The simulated gate tunneling currents as a function of gate voltage (corrected for flatband voltages) are shown in FIG. 9D. As is illustrated in FIG. 9D, the exemplary flash memory experimental design structures SE3 or SE4 that include $C_{60}$—PCBM or $C_{70}$—PCBM, respectively, had higher gate tunneling currents in comparison with the exemplary flash memory experimental design structure SE2 that included the $C_{60}$ neat non-engineered fullerene molecule.

When a large positive gate bias voltage is applied to a flash memory structure in accordance with the additional embodiments, an engineered fullerene molecule with the highest LUMO level passes through the largest amount of current. This phenomenon may be understood by evaluating the energy band diagram of the programming operation for a flash memory structure in accordance with the embodiments, as illustrated in FIG. 10 at the left hand diagram, where the lines connecting PL and PR correlate from top to bottom with $C_{60}$—PCBM, $C_{70}$—PCBM and $C_{60}$ (two lines), respectively.

A total tunneling probability for passage of a charge carrier through a double tunnel barrier may be considered to depend on both: (1) a tunneling probability through a left barrier (PL) which includes a thinner barrier of thickness 2.5 nanometers; and (2) a tunneling probability through a right barrier (PR) which includes a thicker barrier of thickness 3 nanometers. The PL at programming is controlled by the left barrier height, which is same for all three engineered fullerene molecules. During a program operation a PR depends on the LUMO levels of the engineered fullerene molecules. The higher the LUMO of a particular engineered fullerene molecule is relative to a silicon semiconductor substrate, the smaller the barrier height for PR, therefore a larger current can tunnel through. Thus, one may conclude that the right barrier which is controlled by the engineered fullerene molecule is the barrier that controls the total tunneling probability and provides for the tuning of tunneling current.

Figure 10:
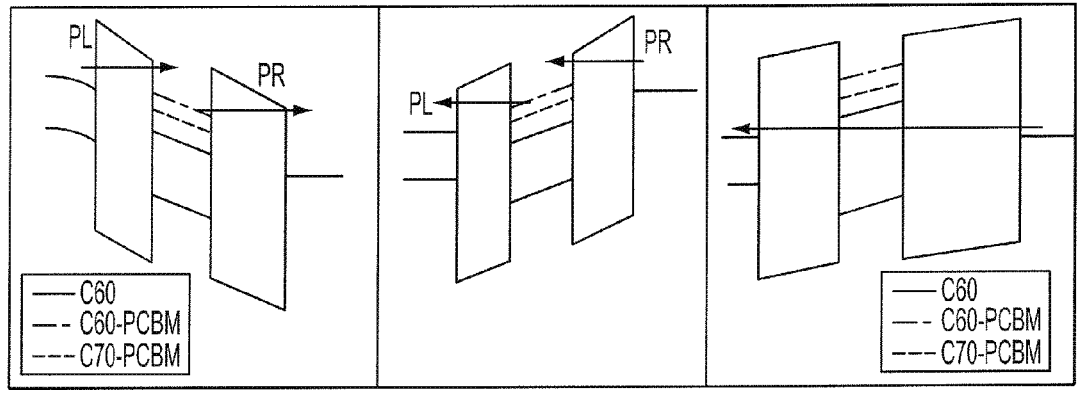
FIG. 10 shows a tunneling diagram illustrating resonant double barrier tunneling and non-resonant tunneling within a flash memory structure in accordance with the additional embodiments.

In contrast, during an erase operation as shown in FIG. 10 at the middle diagram, when a large negative voltage is applied, PR is the same for all three molecules, and PL depends on the LUMO levels of the engineered fullerene molecule. Since PR is thus a bottleneck for the total tunneling probability, a small difference can be seen in the middle figure of FIG. 10 for negative gate voltages.

A larger HOMO/LUMO gap favors a longer retention time, as illustrated in the right hand figure of FIG. 10, where double tunneling of electrons is the block at this small bias and the effective barrier thickness becomes much larger than it is in program/erase operation. An engineered fullerene molecule with a higher LUMO level, as well a larger HOMO/LUMO gap, may provide a better double tunnel barrier design for a fullerene molecule embedded hybrid dielectric based non-volatile flash memory structure device.

Figure 11:
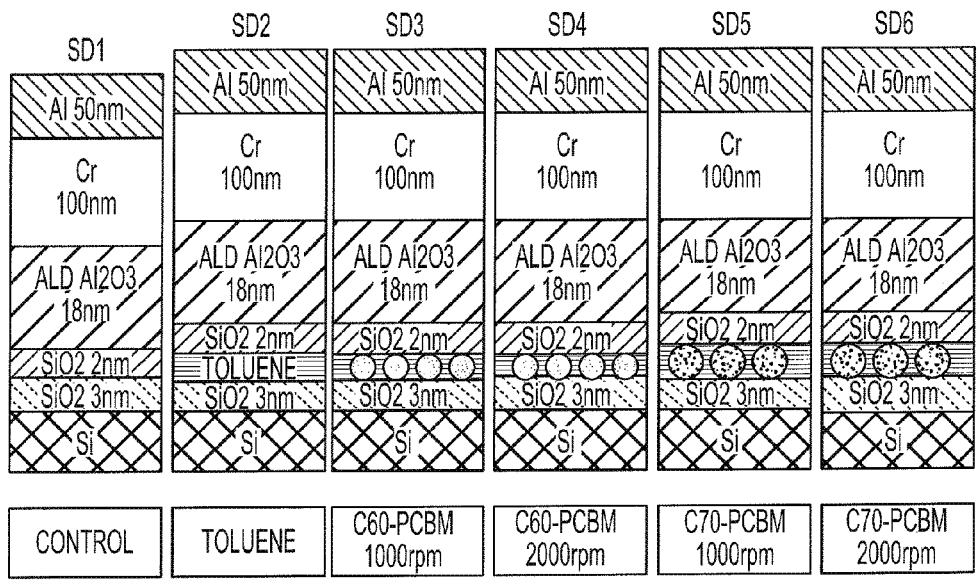
FIG. 11 shows a second series of exemplary flash memory experimental design structures that may be fabricated in accordance with the additional embodiments.

Additional exemplary flash memory experimental design structures are shown in FIG. 11 as SD1, SD2, SD3, SD4, SD5 and SD6. These experimental design structures newly add an aluminum oxide blocking dielectric interposed between: (1) the control gate that comprises the aluminum/chromium laminate; and (2) the deposited silicon oxide that comprises the tunneling dielectric. These experimental design structures were fabricated using $C_{60}$—PCBM and $C_{70}$—PCBM engineered fullerene molecules at concentrations 0.5 mg/ml in a toluene solution and at a spin speed of 1000 rpm or 2000 rpm for high engineered fullerene molecule number density within a spin coat deposited engineered fullerene molecule material layer. The toluene solvent residual was removed through evaporation in nitrogen purge ambient only. The newly added aluminum oxide blocking dielectric includes 18 nanometers atomic layer deposition (ALD) deposited aluminum oxide ($Al_2O_3$) with small trap density, improved electrostatic properties and good integration capabilities.

Figure 12:
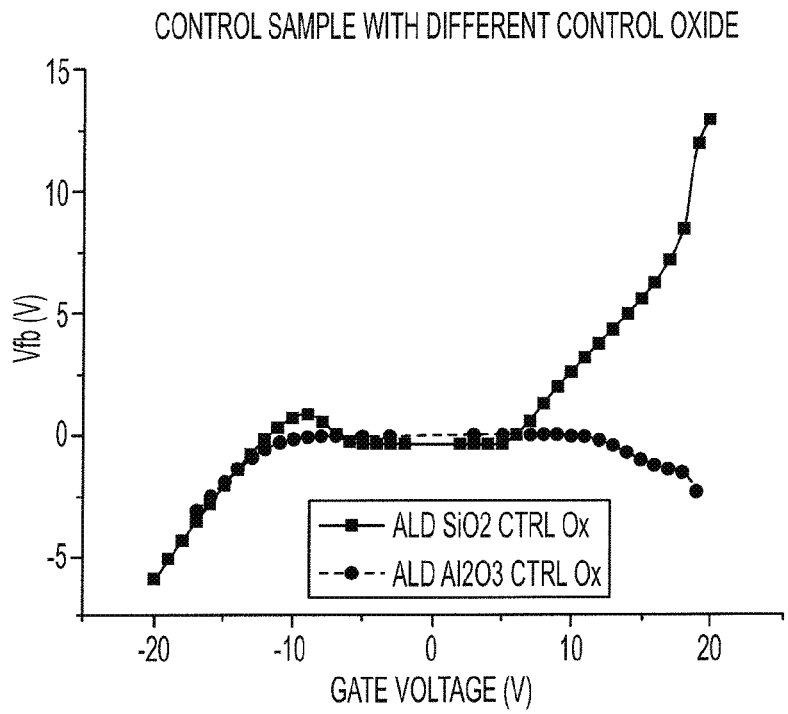
FIG. 12 shows a graph of Flatband Voltage versus Gate Voltage for control exemplary flash memory experimental design structures in accordance with the second series of exemplary flash memory experimental design structures in accordance with the additional embodiments.

A variation of the flatband voltage extracted from capacitance versus voltage measurements as a function of gate voltage for different blocking dielectrics is shown in FIG. 12. Experimental design structure SD1 with aluminum oxide clearly showed a minimal flatband voltage change up to 12 volts (i.e., superior blocking dielectric performance), while an exemplary flash memory experimental design structure that included a silicon oxide blocking dielectric material did not (i.e., inferior blocking dielectric performance). As is understood, aluminum oxide is a high dielectric constant dielectric material, and incorporating a higher dielectric constant dielectric material at an equivalent oxide thickness into a flash memory structure gate stack may enable an aggressive cell scaling through enhanced short-channel effect (SCE) control without compromising the flash memory device performance.

In order to initiate electron injection into the lowest available energy level, LUMO, a change in bandgap of an engineered fullerene molecule should be large enough to overcome an additional band offset between a silicon semiconductor substrate conduction band edge and an engineered fullerene molecule LUMO level. Secondly, the LUMO level needs to be moved further deep to give the one electron charging energy $E_{CH}$ difference required for the electron to inject into the engineered fullerene molecule LUMO level.

Figure 13A:
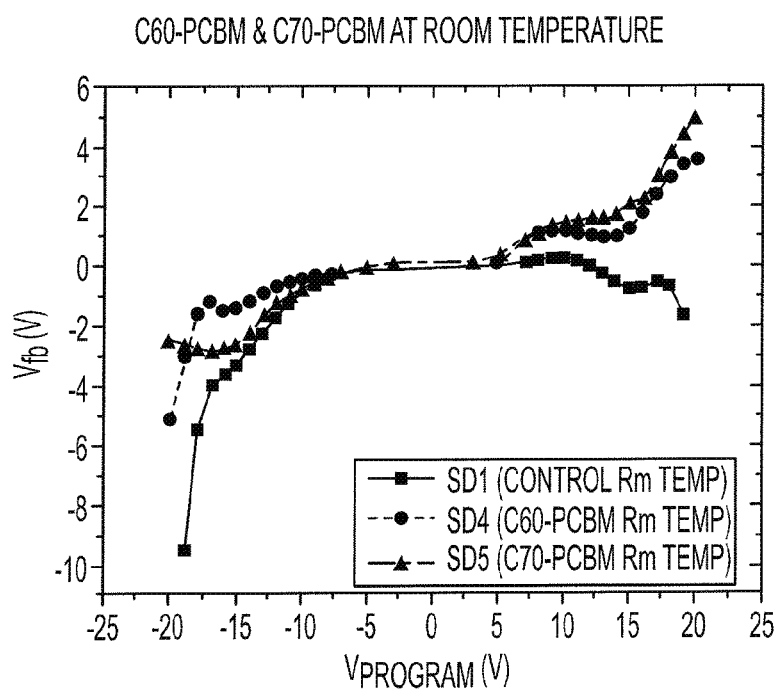
FIG. 13A, FIG. 13B and FIG. 13C show a series of graphs of Flatband Voltage versus Program Voltage for exemplary flash memory experimental design structures in accordance with the second series of exemplary flash memory experimental design structures in accordance with the additional embodiments.

From the Flatband Voltage versus Program Voltage experimental data as illustrated in the graph of FIG. 13A, a starting point of a Coulomb plateau and staircase represents the initiation of electron injection. By extracting the change in engineered fullerene molecule bandgap with calculated coupling ratio, an estimation of the LUMO level of a particular engineered fullerene molecule can be obtained. To sharpen the plateau, and prove that a room temperature Coulomb staircase as is illustrated in FIG. 13A was indeed due to the embedded engineered fullerene molecules, low temperature (i.e., 10 degrees Kelvin) flatband voltage versus gate voltage measurements were obtained as well.

Figure 13B:
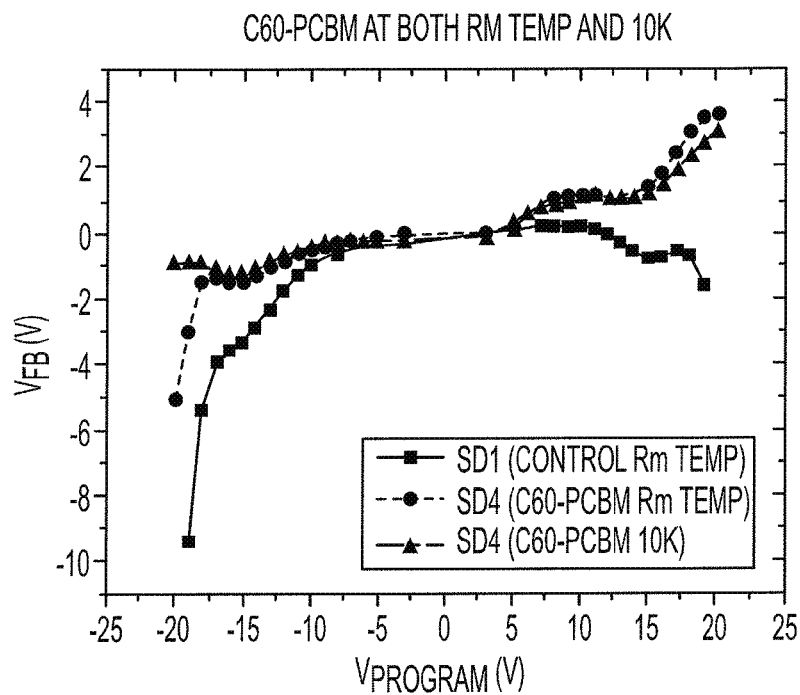

The graph of FIG. 13B illustrates Flatband Voltage versus Program Voltage measurements at both temperatures (i.e., room temperature and 10 degrees Kelvin) of sample SD4 containing $C_{60}$—PCBM. Minimal difference is seen between the two curves, supporting a conclusion that a Coulomb staircase behavior observed at room temperature did not arise from a Frenkel-Poole (F-P) conduction, but rather from an electronic interaction of the LUMO levels of an engineered fullerene molecule as part of the dielectric stack. This also supports a conclusion of low density of interface states, since electrons had minimal available states to relax into even at room temperature. The flatness of the plateau in FIG. 13B represents minimal energy dispersion, and is presumably a reasonable indication that the solution phase integration protocols for engineered fullerene molecule incorporation into a tunneling dielectric maintained the integrity of the engineered fullerene molecules.

Figure 13C:
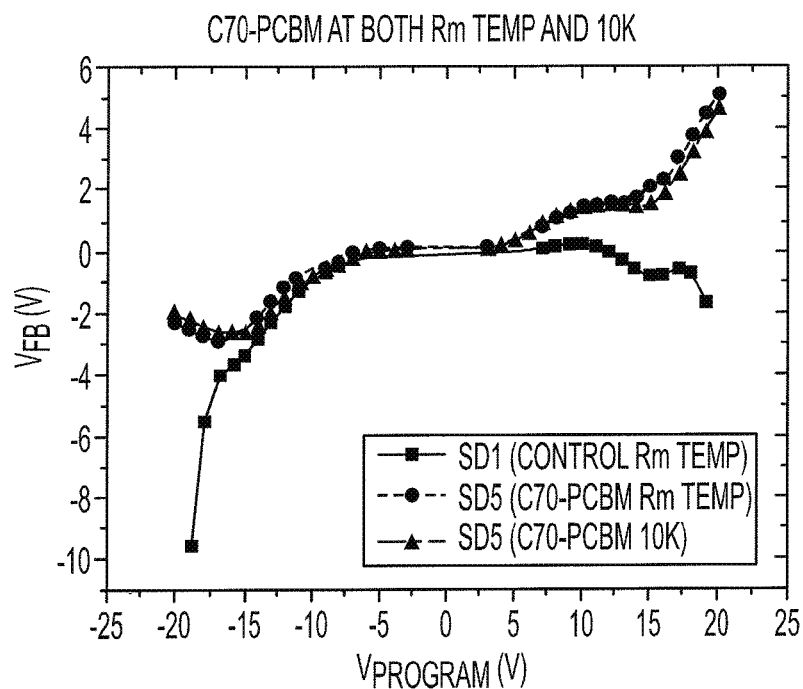

Similar results were also obtained for $C_{70}$—PCBM incorporated into a tunneling dielectric, as can be seen from the Flatband Voltage versus Program Voltage graph of FIG. 13C, showing the room temperature and low temperature flatband versus program voltage measurements.

Figure 14:
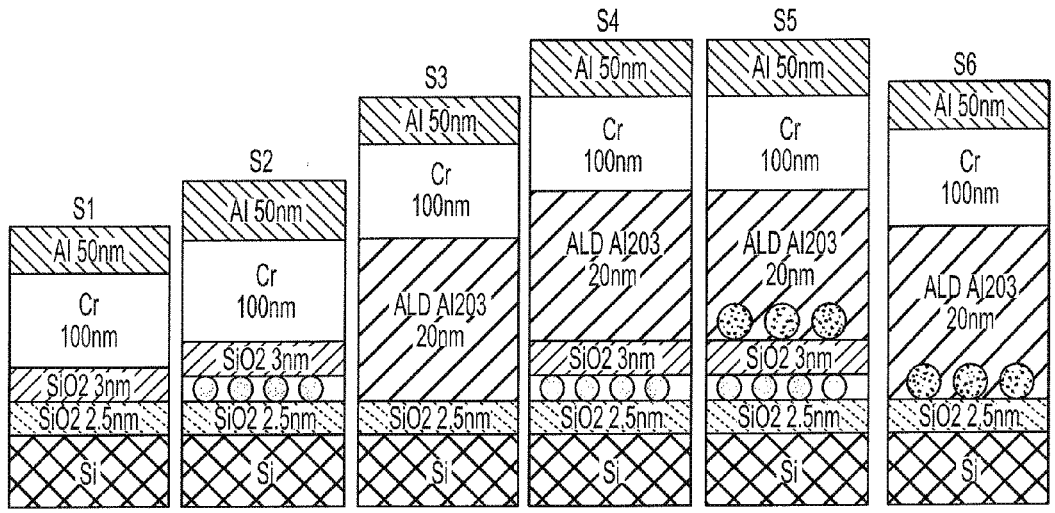
FIG. 14 shows a third series of exemplary flash memory experimental design structures that may be fabricated in accordance with the additional embodiments.

FIG. 14 shows a third series of exemplary flash memory experimental design structures S1, S2, S3, S4, S5 and S6 in accordance with the additional embodiments, where the individual components and layers within the third set of exemplary flash memory experimental design structures correspond with materials as previously described and may overlap with exemplary flash memory experimental design structures within the first series of exemplary flash memory experimental design structures and the second series of exemplary flash memory experimental design structures. Notable within the third series of exemplary flash memory experimental design structures in accordance with the additional embodiments is the inclusion of gold nanocrystals beneath the aluminum oxide blocking dielectric in both exemplary flash memory experimental design structure S5 and S6. Thus, exemplary flash memory experimental design structure S5 shows a completed flash memory structure in accordance with the embodiments.

Within the third series of exemplary flash memory experimental design structures, S1 and S2 are again capacitor type structures that are respectively illustrative of: (1) a single dielectric tunnel barrier; and (2) a double dielectric tunnel barrier with a $C_{60}$—PCBM engineered fullerene molecule material layer located and formed interposed between separated tunneling dielectrics.

Figure 15:
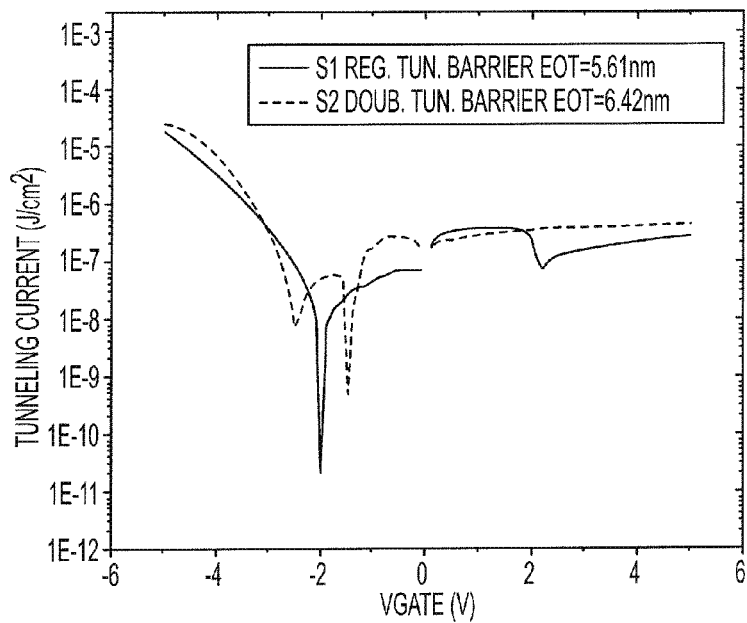
FIG. 15 shows a graph of Tunneling Current versus Gate Voltage for a conventional tunnel barrier exemplary flash memory experimental design structure and a double tunnel barrier exemplary flash memory experimental design structure in accordance with the third series of exemplary flash memory experimental design structures in accordance with the additional embodiments.

FIG. 15 shows a graph of Tunneling Current versus Gate Voltage for the S1 experimental design structure (i.e., valley at about −2.0 volts) and the S2 experimental design structure (i.e., valley at about −1.7 volts) with the C60-PCBM engineered fullerene molecule sandwiched in between two tunneling dielectrics. It is observed that the electrically extracted equivalent oxide thickness (EOT) of the S1 experimental design structure was 5.61 nanometers, and for the S2 experimental design structure is 6.42 nanometers, presumably due to the extra dielectric contribution from the engineered fullerene molecule. If there is no additional tunneling path present in the S2 experimental design structure, the gate current through the S2 experimental design structure should be lower than the S1 experimental design structure at the same electrical field due to a larger barrier at a moderate gate bias (i.e., direct tunneling and Fowler-Nordheim tunneling regime).

The sudden changing current that resembles an N-curve (i.e., resonant double tunneling) for the double tunnel barrier S2 experimental design structure is a promising indication of an additional tunneling pathway formed in the S2 experimental design structure at low gate bias, which is clearly not seen in the control sample S1 experimental design structure. For a relatively higher gate bias voltage, although a current in the S2 experimental design structure is only slightly higher than the S1 experimental design structure, it is noted that the S2 experimental design structure has a greater equivalent oxide thickness than the S1 experimental design structure.

FIG. 16A, FIG. 16B, FIG. 16C and FIG. 16D show graphs of Capacitance versus Gate Voltage for experimental design structures S3, S4, S5 and S6. Experimental design structure S3 was a control structure with a 2.5 nanometer tunneling dielectric. Experimental design structure S6 was a flash memory structure in accordance with experimental design structure S3, but also including gold nanocrystals as a charge storage site within a floating gate. Experimental design structure S4 was a control structure for a double tunnel barrier (i.e., tunneling dielectric) gate stack, and experimental design structure S5 was the targeted flash memory structure with a double tunnel barrier tunneling dielectric and a gold nanocrystal floating gate charge storage site.

Figure 16A:
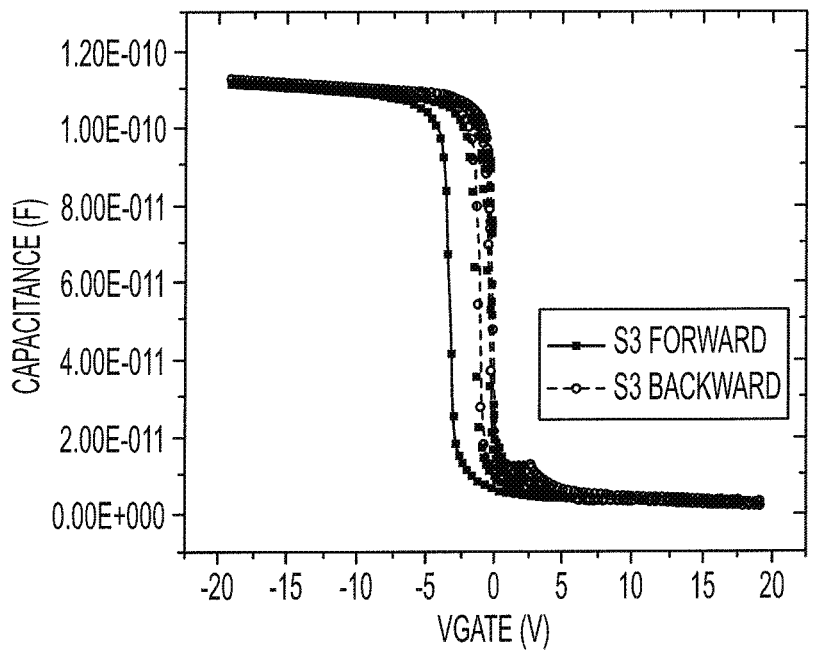
FIG. 16A, FIG. 16B, FIG. 16C and FIG. 16D show a series of graphs of Capacitance versus Gate Voltage for four exemplary flash memory experimental design structures in accordance with the third series of exemplary flash memory experimental design structures in accordance with the additional embodiments.
Figure 16B:
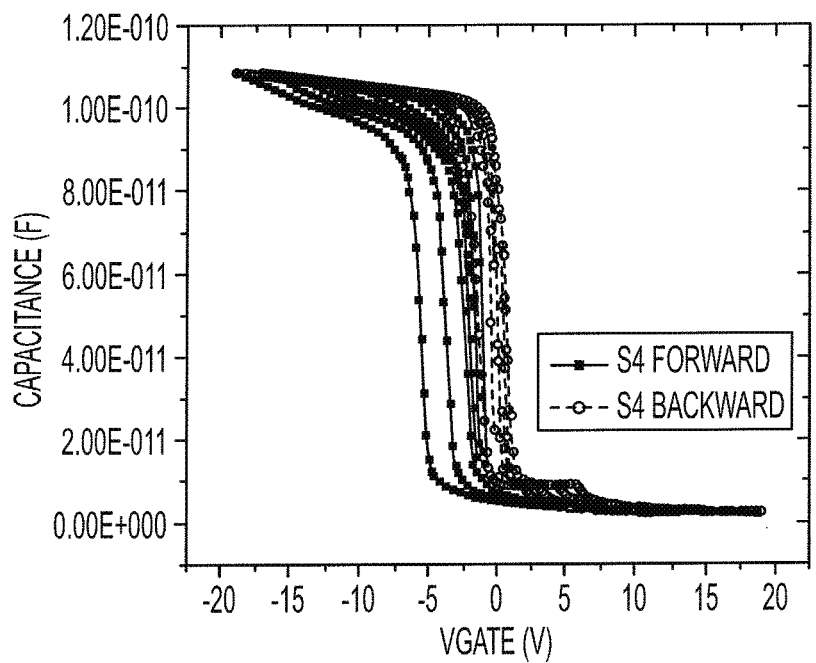
Figure 16C:
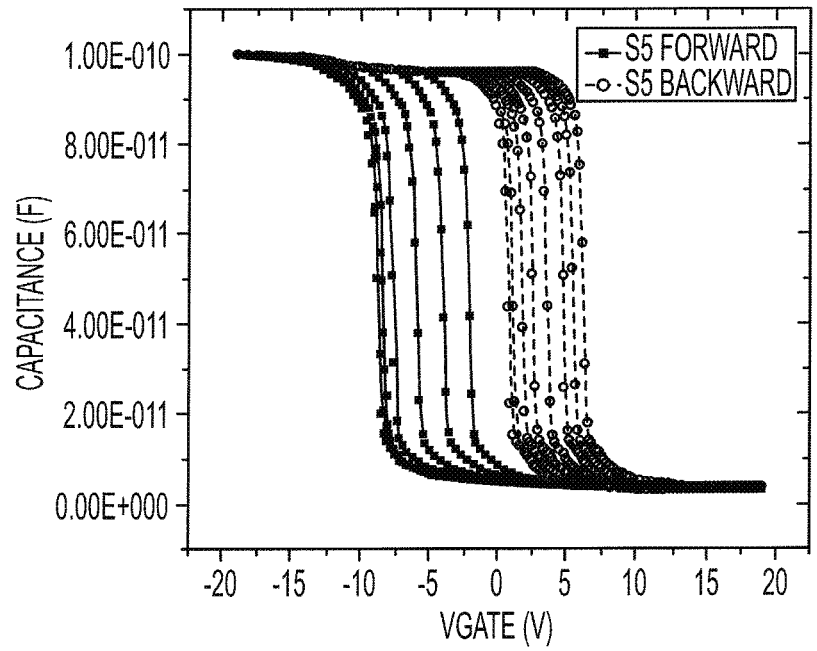
Figure 16D:
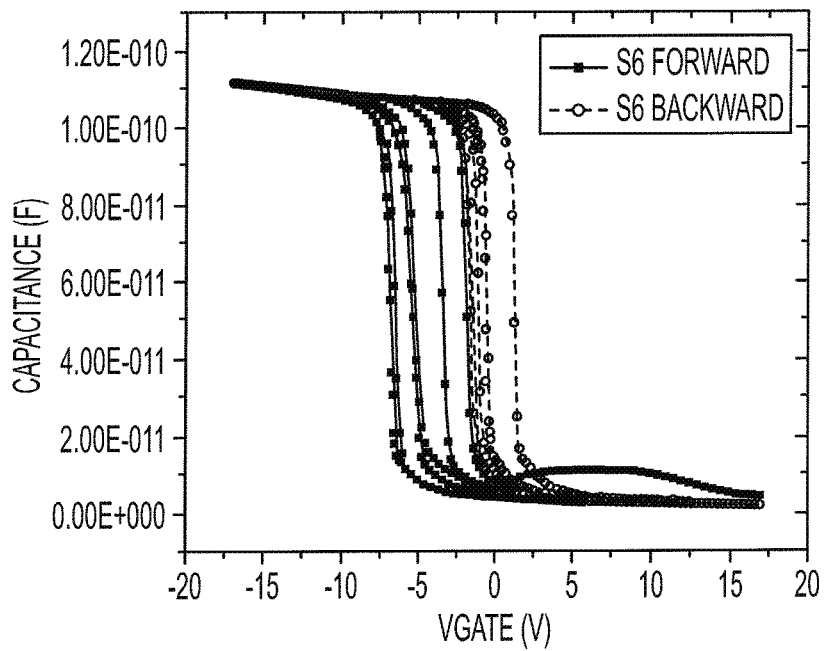

As is illustrated in the foregoing figures, the graph of FIG. 16C corresponding with experimental design structure S5 shows the greatest capacitance area as a function of gate voltage. Thus, this particular experimental design structure comprises the most robust of the evaluated experimental design structures within the context of ease of programming ability for a flash memory structure.

Figure 17A:
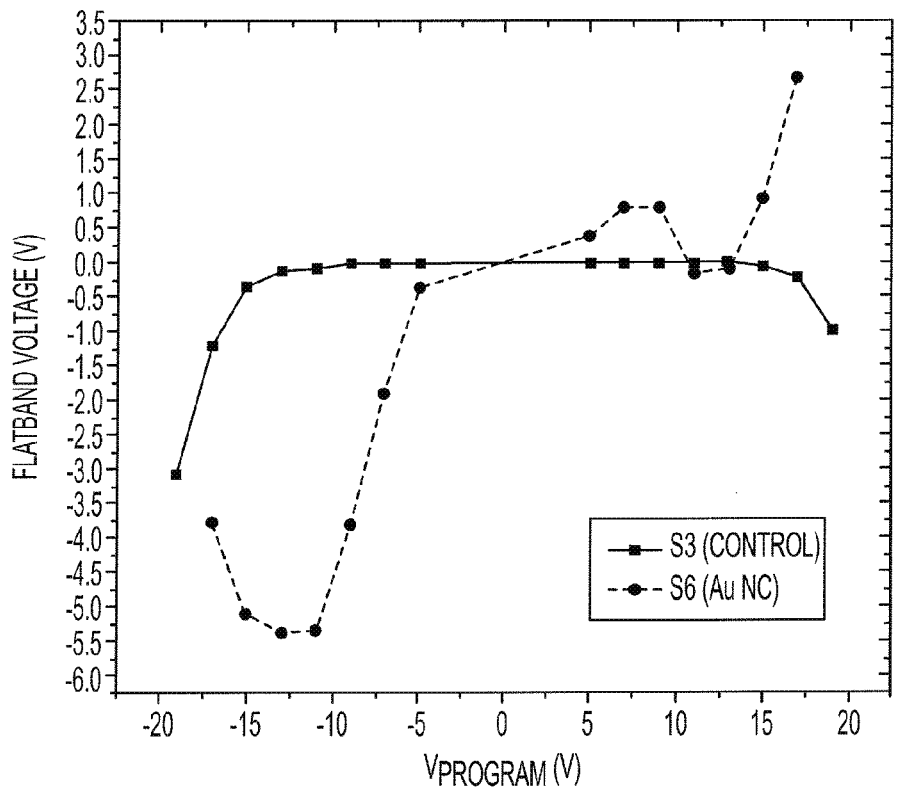
FIG. 17A and FIG. 17B show a pair of graphs of Flatband Voltage versus Program Voltage for four exemplary flash memory experimental design structures in accordance with the third series of exemplary flash memory experimental design structures in accordance with the additional embodiments.
Figure 17B:
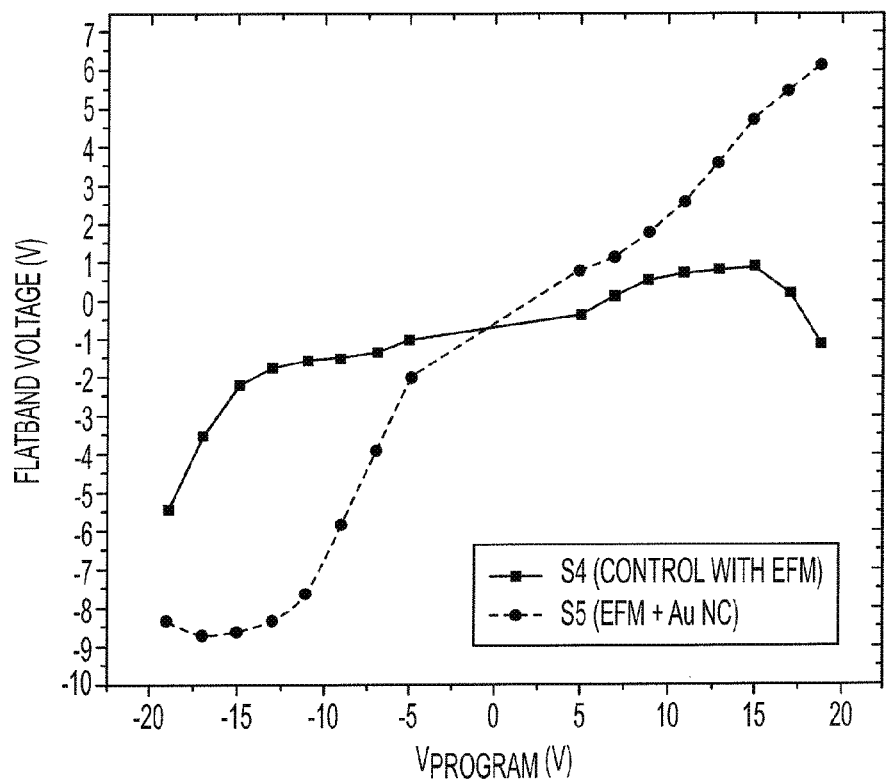

FIG. 17A and FIG. 17B show graphs of Flatband Voltage versus Program Voltage derived from the data of the graphs of FIG. 16A, FIG. 16B, FIG. 16C and FIG. 16D. Particularly notable are the comparison of the data for experimental design structures S3 and S4 which are both intended as control samples, but wherein within experimental design structure S4 at positive voltage there is a rise in flatband voltage as a function of program voltage. This particular rise, which is not shown in the data for experimental design structure S3 as illustrated in FIG. 17A, may presumably be interpreted within the context of a coulomb staircase or blockade effect.

Figure 18:
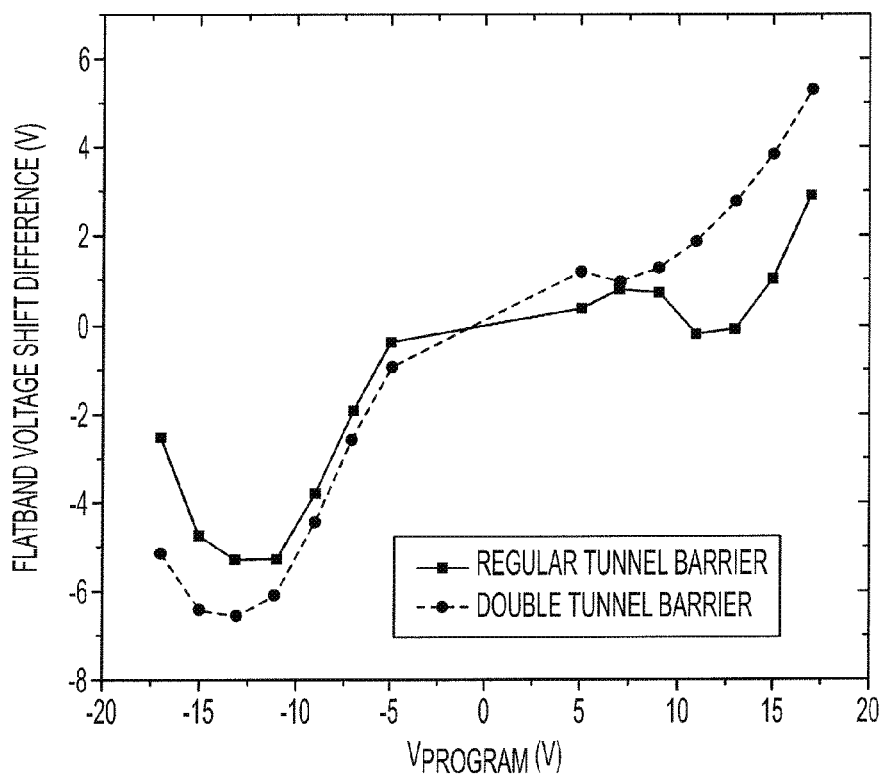
FIG. 18 shows a graph of Flatband Voltage Shift versus Program Voltage for a conventional tunnel barrier exemplary flash memory experimental design structure and a double tunnel barrier exemplary flash memory experimental design structure in accordance with the third series of exemplary flash memory experimental design structures in accordance with the additional embodiments.

FIG. 18 shows a graph of Flatband Voltage Shift versus Program Voltage for experimental design structures S6 minus S3 (for a single tunnel barrier) and for experimental design structures S5 minus S2 (for a double tunnel barrier). As is illustrated in FIG. 18, both programming and erase operations have a greater flatband voltage shift for the double tunnel barrier structure in comparison with the single tunnel barrier structure.

Figure 19:
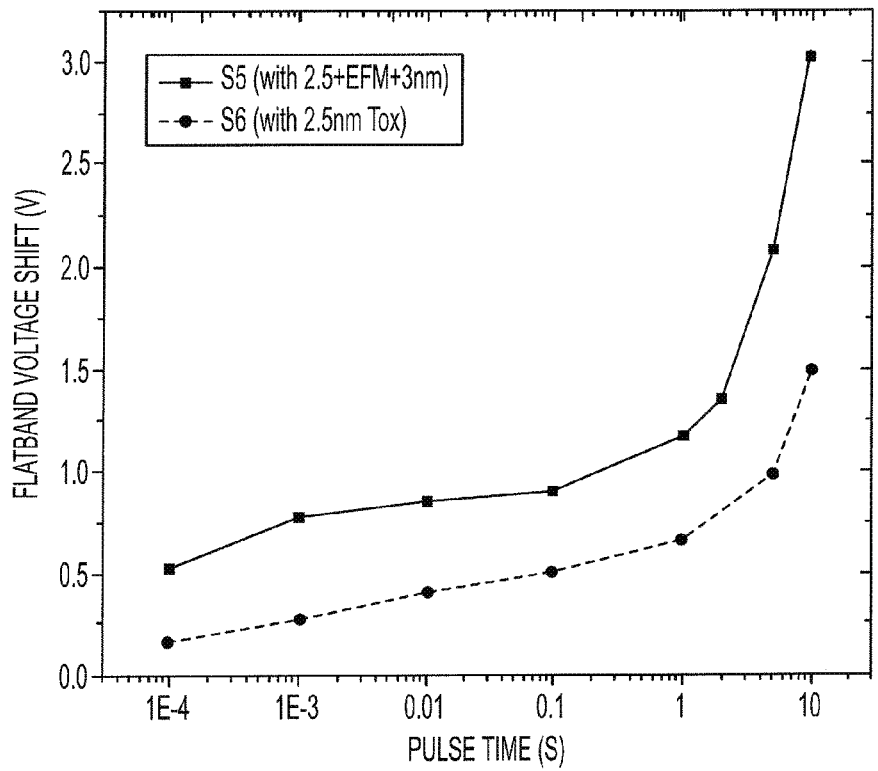
FIG. 19 shows a graph of Flatband Voltage versus Pulse Time for two exemplary flash memory experimental design structures in accordance with the third series of exemplary flash memory experimental design structures in accordance with the additional embodiments.

FIG. 19 shows a graph of Flatband Voltage versus Pulse Time for experimental design structure S5 and experimental design structure S6 programmed in the dark with a programming voltage of 10 volts. Notable from FIG. 19 is the increased flatband voltage for experimental design structure S5 in comparison with experimental design structure S6.

Figure 20:
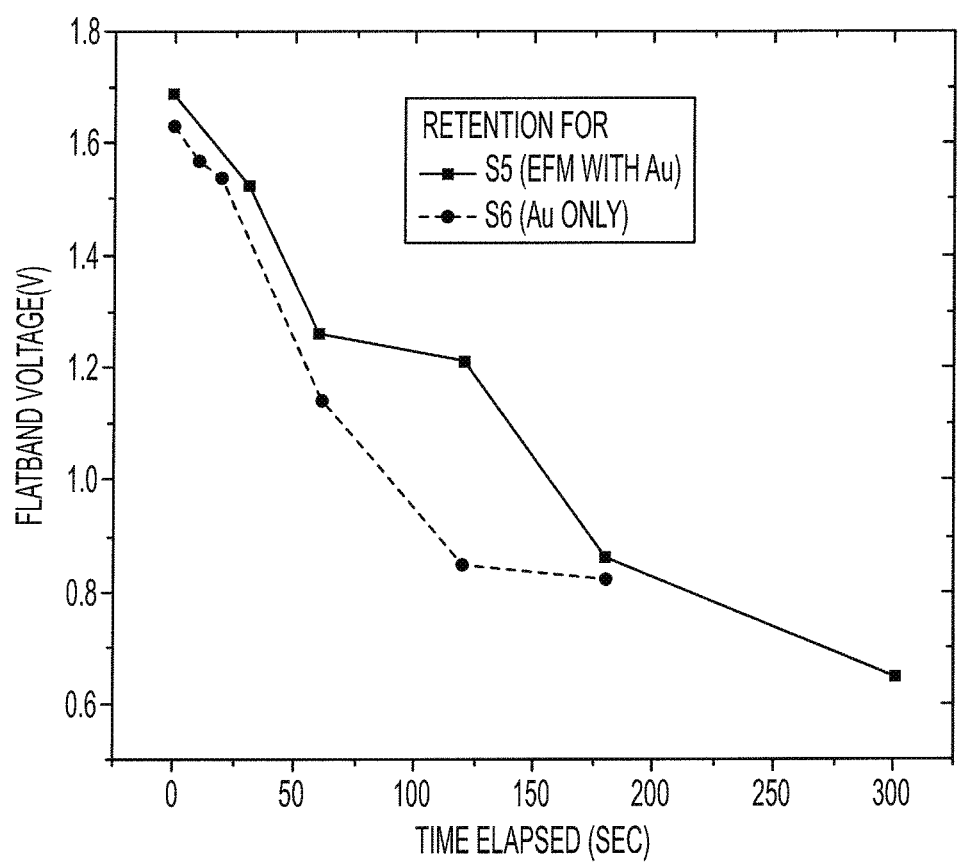
FIG. 20 shows a graph of Flatband Voltage versus Time Elapsed for two exemplary flash memory experimental design structures in accordance with the third series of exemplary flash memory experimental design structures in accordance with the additional embodiments.

FIG. 20 shows a graph of Flatband Voltage versus Time Elapsed which is intended as representative of retention time characteristics of experimental design structure S5 in comparison with experimental design structure S6. As is illustrated in FIG. 20, retention time characteristics of experimental design structure S5 are improved in comparison with retention time characteristics of experimental design structure S6.

While the present application has been described with reference to a number of specific embodiments, it will be understood that the true spirit and scope of the application should be determined only with respect to claims that can be supported by the present specification. Further, while in numerous cases herein wherein systems and apparatuses and methods are described as having a certain number of elements it will be understood that such systems, apparatuses and methods can be practiced with fewer than the mentioned certain number of elements. Also, while a number of particular embodiments have been set forth, it will be understood that features and aspects that have been described with reference to each particular embodiment can be used with each remaining particularly set forth embodiment. For example, features or aspects described using FIG. 1a can be applied to embodiments described using FIG. 6.

The embodiments are thus illustrative of the invention rather than limiting of the invention. Revisions and modifications may be made to methods, materials structures and dimensions of flash memory structures and methods for fabricating the flash memory structures in accordance with the embodiments while still providing flash memory structures and methods for fabrication thereof in accordance with the invention, further in accordance with the accompanying claims.

What is claimed is:

1. A nonvolatile flash memory card, comprising:
a random access memory array;
an input/output unit to operatively connect the random access memory to receive or transmit data; and
a microcontroller to control data storage or data retrieval between the input/output unit and the random access memory array, wherein at least one cell of the random access memory array comprises,
a semiconductor region having a source region, a drain region, and a channel region provided between the source region and the drain region,
a first tunnel insulation film formed on the channel region,
a barrier layer formed on the first tunnel insulation film, the barrier layer comprising a layer of fullerene molecules, the barrier layer including a prescribed energy barrier level,
a second tunnel insulation film formed on the barrier layer,
a charge storage portion formed over the second tunnel insulation film, and
a control electrode on the charge storage portion.

2. The nonvolatile flash memory card of claim 1, wherein said barrier layer is monodispersed fullerene molecules.

3. The nonvolatile flash memory card of claim 2, wherein the monodispersed fullerene molecules comprise $C_{60}$ molecules.

4. The nonvolatile flash memory card of claim 2, wherein said monodispersed fullerene molecules are conductive.

5. A method of forming a tunnel barrier for a semiconductor device, comprising:
providing an active region at a semiconductor substrate; and
providing a tunnel insulating film over the active region, wherein providing the tunnel insulating film comprises,
forming a first tunnel insulation layer formed over the active region,
forming a layer of conductive fullerene molecules over the first tunnel insulation layer, and
forming a second tunnel insulation layer formed over the monodispersed fullerene molecules, wherein the tunnel insulating film comprises the tunnel barrier.

6. The method of forming a tunnel barrier for a semiconductor device of claim 5, comprising:
providing a charge storage layer over the tunnel insulating film;
providing an insulating film provided on the charge storage layer; and
providing a conductive layer provided on the insulating film.

7. A semiconductor structure comprising:
a semiconductor substrate including a source region and a drain region that are separated by a channel region;
a tunneling dielectric located over the channel region;
a floating gate located over the tunneling dielectric;
a blocking dielectric located over the floating gate; and
a control gate located over the blocking dielectric, where at least the tunneling dielectric comprises at least in-part an engineered fullerene molecule.

8. The semiconductor structure of claim 7 wherein the semiconductor substrate comprises a silicon semiconductor substrate.

9. The semiconductor structure of claim 7 wherein the engineered fullerene molecule is included within the tunneling dielectric.

10. The semiconductor structure of claim 7 wherein the engineered fullerene molecule is included within both the tunneling dielectric and the floating gate.

11. The semiconductor structure of claim 7 wherein the engineered fullerene molecule has the chemical formula $C_nR_m$, wherein:
n is selected from the group consisting of 60, 70, 76, 78, 84; and
m is an integer between 1 and 48.

12. The semiconductor structure of claim 11 wherein R comprises a pendant moiety selected from the group consisting of hydrogen, halogen, —OH, —CN, aromatic and alkyl group radical pendent moieties.

13. The semiconductor structure of claim 12 wherein the pendant moiety is covalently bonded to a base fullerene molecule.

14. The semiconductor structure of claim 7 wherein the engineered fullerene molecule is selected to provide a coulomb staircase effect when electrically actuating the semiconductor structure.

15. A method for forming a semiconductor structure comprising:
forming a tunneling dielectric material layer over a semiconductor substrate;
forming a floating gate material layer over the tunneling dielectric material layer;
forming a blocking dielectric material layer over the floating gate material layer; and
forming a control gate material layer over the blocking dielectric material layer to provide a blanket gate stack layer from the foregoing four material layers where at least the tunneling dielectric material layer is formed at least in-part from an engineered fullerene molecule material layer;
patterning at least a portion of the blanket gate stack layer to form a gate stack; and
forming a source region and a drain region separated by a channel region beneath the gate stack into the semiconductor substrate while using the gate stack as a mask.

16. The method of claim 15 wherein the engineered fullerene material layer is formed using a spin coating method.

17. The method of claim 15 wherein the semiconductor substrate comprises a silicon semiconductor substrate.

18. The method of claim 15 wherein the engineered fullerene molecule material layer is included within the tunneling dielectric material layer.

19. The method of claim 15 wherein the engineered fullerene molecule material layer is included within both the tunneling dielectric material layer and the floating gate material layer.

20. The method of claim 15 wherein the engineered fullerene molecule has the chemical formula $C_nR_m$, wherein:
n is selected from the group consisting of 60, 70, 76, 78, 84; and
m is an integer between 1 and 48.

21. The method of claim 20 wherein R comprises a pendant moiety selected from the group consisting of hydrogen, halogen, —OH, —CN, aromatic and alkyl group radical pendent moieties.

22. The method of claim 21 wherein the pendant moiety is covalently bonded to the base fullerene molecule.

23. The method of claim 15 wherein the engineered fullerene molecule is selected to provide a coulomb staircase effect when electrically actuating the semiconductor structure.

24. The nonvolatile flash memory card of claim 2 wherein the monodispersed fullerene molecule have the chemical formula $C_nR_m$, wherein:
   n is selected from the group consisting of 60, 70, 76, 78, 84; and
   m is an integer between 1 and 48.

25. The nonvolatile memory card of claim 24 wherein R comprises a pendant moiety selected from the group consisting of hydrogen, halogen, —OH, —CN, aromatic and alkyl group radical pendent moieties.

26. The nonvolatile memory card of claim 25 wherein the pendant moiety is covalently bonded to a base fullerene molecule.

* * * * *